United States Patent
Tanahashi et al.

(10) Patent No.: US 10,543,601 B2
(45) Date of Patent: Jan. 28, 2020

(54) WORKPIECE CONVEYING DEVICE

(71) Applicant: Mitsubishi Electric Corporation, Tokyo (JP)

(72) Inventors: Kunihiro Tanahashi, Tokyo (JP); Kenji Saruta, Aichi (JP); Motohiko Hirao, Aichi (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/330,769

(22) PCT Filed: Oct. 27, 2016

(86) PCT No.: PCT/JP2016/081956
§ 371 (c)(1),
(2) Date: Mar. 6, 2019

(87) PCT Pub. No.: WO2018/078780
PCT Pub. Date: May 3, 2018

(65) Prior Publication Data
US 2019/0240846 A1  Aug. 8, 2019

(51) Int. Cl.
*B25J 15/06* (2006.01)
*B65G 1/04* (2006.01)
(Continued)

(52) U.S. Cl.
CPC .......... *B25J 15/0616* (2013.01); *B25J 15/08* (2013.01); *B65G 1/04* (2013.01); *B65G 47/91* (2013.01); *B65G 2249/045* (2013.01)

(58) Field of Classification Search
CPC .... B65G 47/918; B65G 47/28; B65G 47/911; B65G 1/04; B65G 47/91; B65G 2249/045;
(Continued)

(56) References Cited

U.S. PATENT DOCUMENTS 5,177,434 A * 1/1993 Suzuki ............... G01R 1/04
198/395
6,217,093 B1 * 4/2001 Neutel ............... B65G 47/28
198/468.3
(Continued)

FOREIGN PATENT DOCUMENTS

CN  204751492 U  11/2015
GB  2178723 A  2/1987
(Continued)

OTHER PUBLICATIONS

International Search Report dated Dec. 6, 2016 for PCT/JP2016/081956 filed on Oct. 27, 2016, 11 pages including English Translation.
(Continued)

*Primary Examiner* — Stephen A Vu
(74) *Attorney, Agent, or Firm* — Xsensus LLP

(57) ABSTRACT

A workpiece conveying device includes a traveling platform which moves on traveling rails, a workpiece sucker arranged below the traveling platform, a vertical drive guide which is provided on the traveling platform and vertically drives the workpiece sucker, and a fork which is placed on the workpiece sucker so as to sandwich the workpiece sucker. With this structure, effects are obtained such that the workpiece conveying device is capable of achieving space saving in a factory and is capable of improving moving accuracy and increasing a moving speed while making it difficult to damage a product.

7 Claims, 25 Drawing Sheets

(51) Int. Cl.
*B25J 15/08* (2006.01)
*B65G 47/91* (2006.01)

(58) Field of Classification Search
CPC ......... H01L 21/67259; H01L 21/68707; H01L 21/6838; G01R 1/04; G01R 31/2893; B25J 15/0061; B25J 15/0226; B25J 15/0616; B25J 15/06; B25J 15/0683; B25J 15/08; B66C 1/0237; B66C 1/0243; B66F 9/181
USPC ........................................................ 294/65
See application file for complete search history.

(56) References Cited

U.S. PATENT DOCUMENTS

| | | | | |
|---|---|---|---|---|
| 6,346,682 | B2* | 2/2002 | Kim | B65G 47/911 209/573 |
| 7,464,807 | B2* | 12/2008 | Ham | G01R 31/2893 198/468.3 |
| 7,954,869 | B2* | 6/2011 | Shim | H01L 21/68707 198/468.3 |
| 8,534,727 | B2* | 9/2013 | Weclawski | B65G 47/918 198/468.3 |
| 9,457,479 | B2* | 10/2016 | Usami | H01L 21/67259 |
| 2006/0169681 | A1 | 8/2006 | Zeygerman | |

FOREIGN PATENT DOCUMENTS

| | | |
|---|---|---|
| JP | 05-237641 A | 9/1993 |
| JP | 07-682 A | 1/1995 |
| JP | 09-278118 A | 10/1997 |
| JP | 2000-301435 A | 10/2000 |
| JP | 2007-507353 A | 3/2007 |
| JP | 2011-046524 A | 3/2011 |
| JP | 2011-110571 A | 6/2011 |
| JP | 2013-086241 A | 5/2013 |
| WO | 2007/046152 A1 | 4/2007 |

OTHER PUBLICATIONS

Notification of Reasons for Refusal received for Japanese Patent Application No. 2017-515992, dated Apr. 20, 2017, 9 pages including English Translation.

Decision to Grant a Patent received for Japanese Patent Application No. 2017-515992, dated Aug. 31, 2017, 6 pages including English Translation.

Chinese Office Action dated Sep. 29, 2019 for the corresponding Chinese patent application No. 201680090295.3.

* cited by examiner

WORKPIECE CONVEYING DEVICE

CROSS-REFERENCE TO RELATED APPLICATION

The present application is based on PCT filing PCT/JP2016/081956, filed Oct. 27, 2016, which is incorporated by reference.

FIELD

The present invention relates to a workpiece conveying device which conveys a material workpiece before being processed or a processed product workpiece.

BACKGROUND

A conveying device disclosed in Patent Literature 1 includes a traveling platform which horizontally moves on traveling rails extending on a horizontal plane, a support which is provided on the traveling platform and extends in the vertical direction, an L-shaped arm of which one end is rotatably connected to the lower end of the support, a driving mechanism which is provided on an upper portion of the support and drives the arm, a vacuum which is connected to the lower end of the support and suctions a material, and a pipe fork which is provided at the other end of the arm and holds the material.

In the conveying device disclosed in Patent Literature 1, at the time of an unloading movement, the other end of the arm swings with a connection point of the arm and the support as a fulcrum first so that the pipe fork moves to the lower side of the vacuum. With this movement, the processed product workpiece placed on a work support is shoveled. Next, the pipe fork which has shoveled the product workpiece horizontally moves to the upper portion of the product carriage integrally with the vacuum. The pipe fork which has moved to the upper position of the product carriage descends together with the vacuum and stops at a position at a certain interval with the upper portion of the product carriage. While keeping the horizontal state at that position, the arm horizontally moves integrally with the traveling platform. With this movement, a product workpiece is loaded on the product carriage. The unloading movement is an operation for conveying the processed product workpiece placed on a processing device or a pallet automatic exchanging device to the product carriage.

CITATION LIST

Patent Literature

Patent Literature 1: Japanese Patent Application Laid-Open. No. 07-000682

SUMMARY

Technical Problem

However, in Patent Literature 1, when the vacuum suctions a material, it is necessary to swing the pipe fork so as not to disturb the suction of the material.
Therefore, there has been a problem in that it is necessary to secure a large space around the vacuum and the product carriage for the movement of the pipe fork and the large space becomes an obstacle of space saving in the factory.

The present invention has been made in view of the above problems, and an object of the present invention is to obtain a workpiece conveying device which can achieve space saving in a factory and improve moving accuracy and increase a moving speed while making it difficult to damage a product.

Solution to Problem

To solve the above described problems and achieve the object a workpiece conveying device according to the present invention includes: a traveling platform to move on traveling rails; a workpiece sucker arranged below the traveling platform; a vertical drive guide, provided on the traveling platform, to vertically drive the workpiece sucker; and a fork to move so as to sandwich the workpiece sucker.

Advantageous Effects of Invention

A workpiece conveying device according to the present invention has an effect to achieve space saving in a factory and to improve moving accuracy and increase a moving speed while making it difficult to damage a product.

DESCRIPTION OF EMBODIMENTS

Hereinafter, a workpiece conveying device according to embodiments of the present invention will be described in detail with reference to the drawings. The present invention is not limited to the embodiments.

First Embodiment

Figure 1:
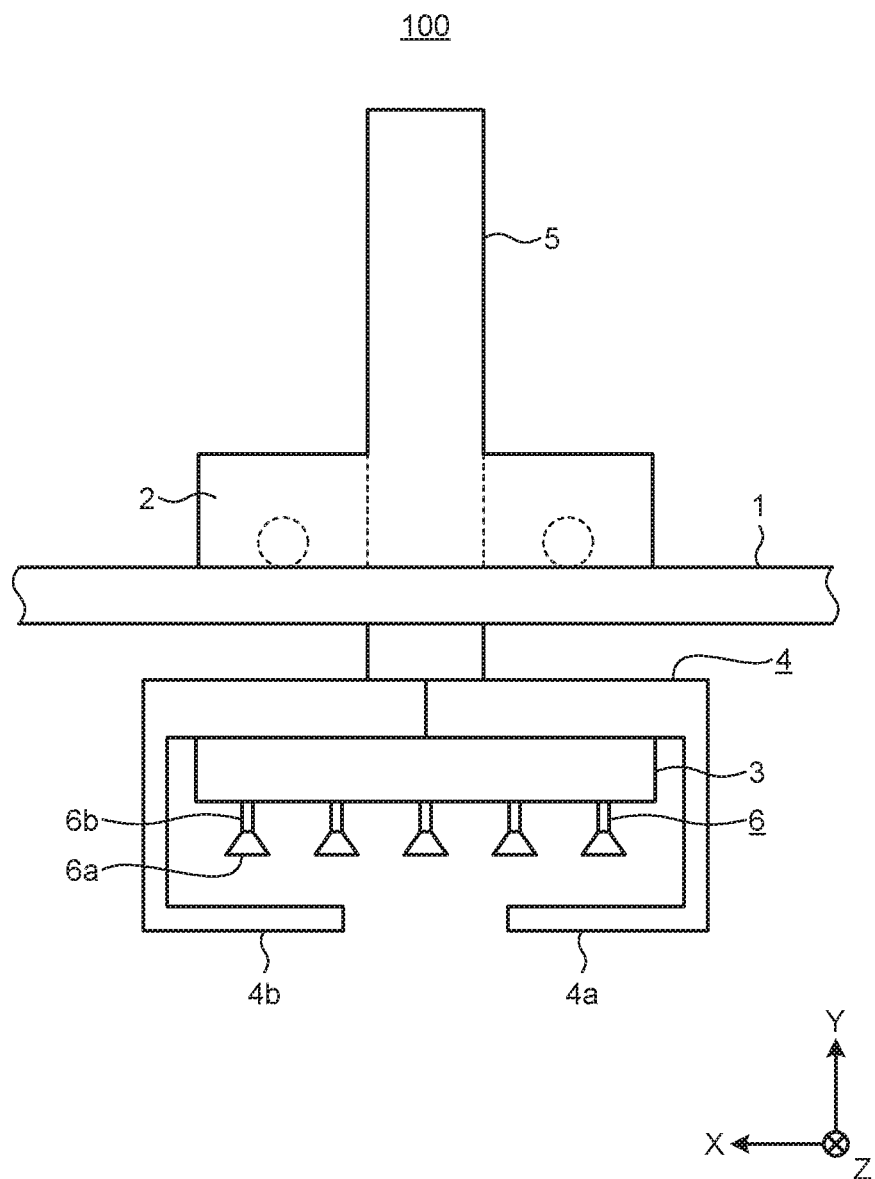
FIG. 1 is a side view of a workpiece conveying device according to a first embodiment of the present invention.
Figure 2:
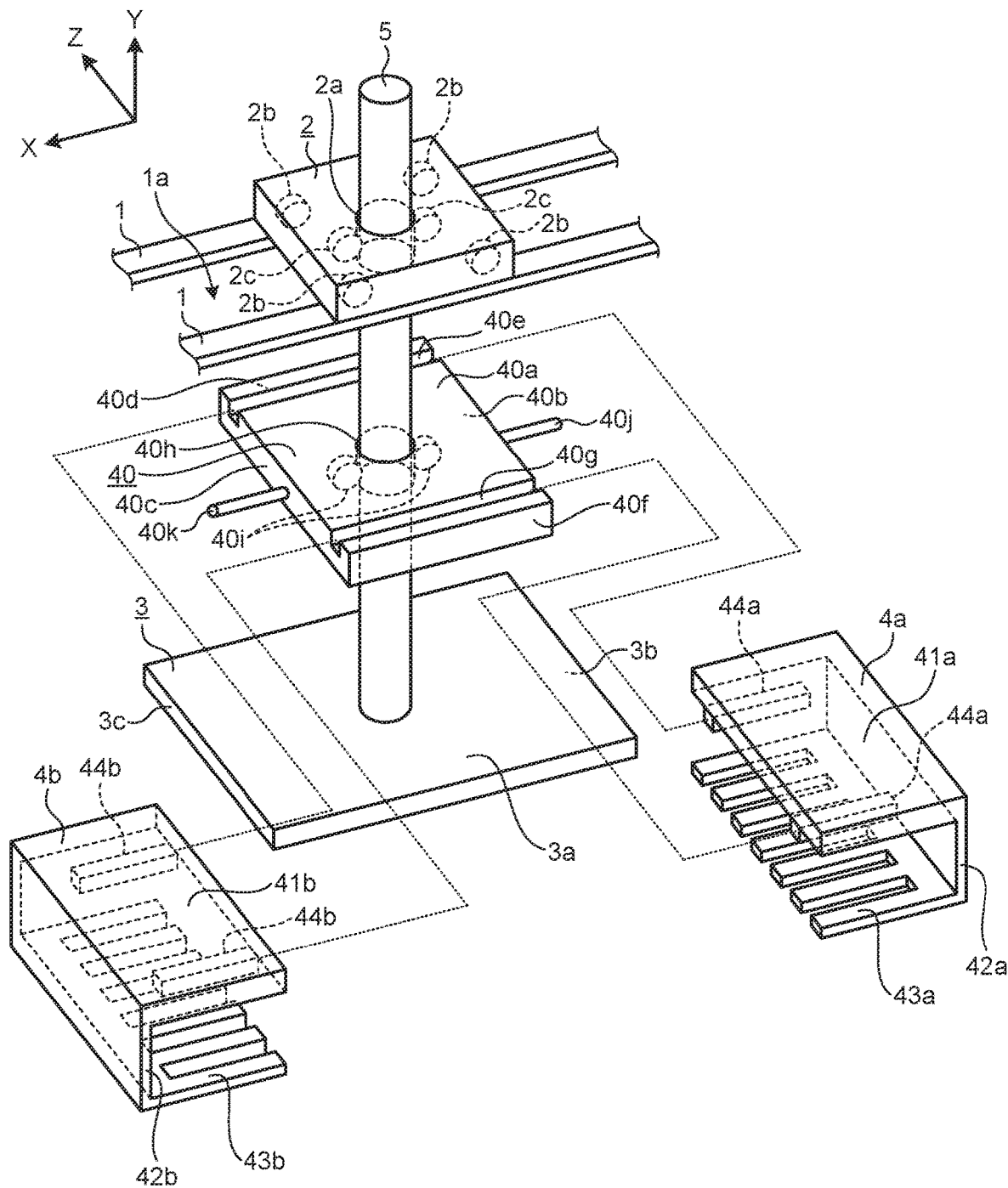
FIG. 2 is an exploded perspective view of the workpiece conveying device illustrated in FIG. 1.

FIG. 1 is a side view of a workpiece conveying device 100 according to a first embodiment of the present invention. FIG. 2 is an exploded perspective view of the workpiece conveying device 100 illustrated in FIG. 1. In FIG. 1, in the right-handed XYZ coordinates, it is assumed that a vertical direction of the workpiece conveying device 100 is a Y-axis direction, a direction orthogonal to the Y-axis direction be an X-axis direction, and a direction orthogonal to both the Y-axis direction and the X-axis direction be a Z-axis direction. The Y-axis direction corresponds to the vertical direction, and an XZ plane formed by the X-axis direction and the Z-axis direction is equal to a horizontal plane. The same applies to the drawings subsequent to FIG. 2.

The workpiece conveying device 100 includes: a traveling platform 2 which moves on a pair of traveling rails 1 straddling the traveling rails 1 extending along the horizontal plane on the horizontal plane; a shaft 5 which passes through the traveling platform 2 and extends in the vertical direction; a plate-like workpiece sucker 3 which is provided at a lower end of the shaft 5 and sucks a workpiece; a fork 4 which suctions a material workpiece or a product workpiece which is placed on the workpiece sucker 3 and will be described later; and a fork driver 40 which drives the fork 4. The material workpiece is a workpiece before processed by a laser processing machine to be described later, and the product workpiece is a workpiece after processed by the laser processing machine. The workpiece sucker 3 is arranged below the traveling platform 2.

The pair of traveling rails 1 is provided to be separated from each other in the Z-axis direction in parallel, and each of the pair of traveling rails 1 extends in the X-axis direction. On upper surface of each of the pair of traveling rails 1, that is, on a surface on the side of the traveling platform 2, a rack (not illustrated) which extends in the X-axis direction is formed. The rack is meshed with a pinion (not illustrated) provided on the traveling platform 2.

The fork driver 40 has a rectangular plate-like shape and is provided between the pair of traveling rails 1 and the workpiece sucker 3. A part of one end portion 40a of the fork driver 40 in the Y-axis direction faces the traveling rail 1 when the fork driver 40 performs an opening movement. The other end portion of the fork driver 40 in the Y-axis direction faces the workpiece sucker 3. A first groove 40e and a second groove 40g are formed on the one end portion 40a of the fork driver 40 in the Y-axis direction. The first groove 40e is formed near one end portion 40d of the fork driver 40 in the Z-axis direction. The second groove 40g is formed near the other end portion 40f of the fork driver 40 in the Z-axis direction. Each of the first groove 40e and the second groove 40g extends from one end portion 40b of the fork driver 40 in the X-axis direction to the other end portion 40c. The first groove 40e and the second groove 40g are arranged in parallel to be separated from each other in the Z-axis direction. A through-hole 40h is formed in a central portion of the fork driver 40. The through-hole 40h passes through the fork driver 40 from the one end portion 40a of the fork driver 40 in the Y-axis direction to the other end portion facing the workpiece sucker 3.

The workpiece sucker 3 has a rectangular plate-like shape. One end portion 3a of the workpiece sucker 3 in the Y-axis direction faces the other end portion of the fork driver 40 in the Y-axis direction. The one end portion 3a of the workpiece sucker 3 is an upper surface of the workpiece sucker 3 and is a surface of the workplace sucker 3 on the side of the fork driver 40. A plurality of suction pads 6 are provided on the other end portion of the workpiece sucker 3 in the Y-axis direction. The other end portion of the workpiece sucker 3 is a lower surface of the workpiece sucker 3 and is a surface of the workpiece sucker 3 opposite to the fork driver 40.

The plurality of suction pads 6 suctions the material workpiece or the product workpiece to be described later. The plurality of suction pads 6 are provided to be separated from each other on the horizontal plane. Each of the plurality of suction pads 6 includes a conical-shaped skirt portion 6a which sucks the material workpiece to be described later and a connection pipe 6b which connects the skirt portion 6a and the workpiece sucker 3. The skirt portion 6a and the connection pipe 6b are integrally formed, and examples of the material of the skirt portion 6a and the connection pipe 6b are synthetic resin or synthetic rubber with high elasticity. An ejector (not illustrated) is connected to each of the plurality of suction pads 6. The ejector which is not illustrated is operated so that the interior of the suction pad 6, having contact with the material workpiece or the product workpiece, is evacuated and the material workpiece or the product workpiece is sucked by the suction pad 6. Hereinafter, the skirt portion 6a and the connection pipe 6b may be simply referred to as a suction pad 6.

The fork 4 includes a pair of holder 4a and holder 4b. The holder 4a and the holder 4b are arranged to face each other in the X-axis direction.

The holder 4a is provided so as to face one end portion 3b of the workpiece sucker 3 in the X-axis direction. The holder 4a includes a slider 41a, an extending portion 42a, a comb-like member 43a, and a pair of shafts 44a.

The slider 41a is provided near the one end portion. 40b of the fork driver 40 in the X-axis direction and provided so as to face the one end portion 40a of the fork driver 40 in the Y-axis direction. The extending portion 42a extends from one end portion of the slider 41a in the X-axis direction toward an opposite side of the traveling platform 2. The one end portion of the slider 41a is an end portion of the slider 41a opposite to the side of the shaft 5. The comb-like member 43a is bent from one end portion of the extending portion 42a in the Y-axis direction toward the holder 4b. The one end portion of the extending portion 42a is an end portion of the extending portion 42a opposite to the side of the slider 41a. The comb-like member 43a includes a plurality of projections that project from the extending portion 42a toward the shaft 5, and the plurality of projections are aligned to be separated from each other in the Z-axis direction.

Each of the pair of shafts 44a is provided on a surface of the slider 41a facing the comb-like member 43a. Each of the pair of shafts 44a has a bar-like shape extending in the X-axis direction, and the shafts 44a are provided in parallel to be separated from each other in the Z-axis direction. The respective shafts 44a are slidably fitted into the first groove 40e and the second groove 40g formed in the fork driver 40. The shafts 44a fitted into the first groove 40e and the second groove 40g are respectively guided by the first groove 40e and the second groove 40g and slide in the X-axis direction. With this structure, swing of the holder 4a at the time of moving is suppressed.

The holder 4b is provided so as to face the other end portion 3c of the workpiece sucker 3 in the X-axis direction. The holder 4b includes a slider 41b, an extending portion 42b, a comb-like member 43b, and a pair of shafts 44b.

The slider 41b is provided near the other end portion 40c of the fork driver 40 in the X-axis direction and provided so as to face the one end portion 40a of the fork driver 40 in the Y-axis direction. The extending portion 42b extends from one end portion of the slider 41b in the X-axis direction toward an opposite side of the traveling platform 2. The one end portion of the slider 41b is an end portion of the slider 41b opposite to the side of the shaft 5. The comb-like member 43b is bent from one end portion of the extending portion 42b in the Y-axis direction toward the holder 4a. The one end portion of the extending portion 42b is an end portion of the extending portion 42b opposite to the side of the slider 41b. The comb-like member 43b includes a plurality of projections from the extending portion 42b toward the shaft 5, and the plurality of projections is aligned to be separated from each other in the Z-axis direction.

Each of the pair of shafts 44b is provided on a surface of the slider 41b facing the comb-like member 43b. Each of the pair of shafts 44b has a bar-like shape extending in the X-axis direction, and the shafts 44a are provided in parallel to be separated from each other in the Z-axis direction. The respective shafts 44b are slidably fitted into the first groove 40e and the second groove 40g formed in the fork driver 40. The shafts 44b fitted into the first groove 40e and the second groove 40g are respectively guided by the first groove 40e and the second groove 40g and slide in the X-axis direction. With this structure, swing of the holder 4b at the time of moving is suppressed.

A rack (not illustrated) which extends in the Y-axis direction is formed on an outer peripheral surface of the shaft 5. The rack is meshed with a pinion to be described later. The shaft 5 is inserted into a through-hole 2a formed in the traveling platform 2, passing through a spacing 1a between the pair of traveling rails 1, and is inserted into the through-hole 40h formed in the fork driver 40.

In the traveling platform. 2, a plurality of rollers 2b which moves the traveling platform 2 on the traveling rails 1 in the X-axis direction and a plurality of rollers 2c which moves the shaft 5 in the Y-axis direction are provided. A driving motor (not illustrated) is built in each of the plurality of rollers 2b and rollers 2c. A driving circuit (not illustrated) which controls the driving motor is provided in the traveling platform 2. A control signal and electric power used to drive the driving circuit and the driving motor are supplied via a cable (not illustrated). The control signal used to drive the driving circuit and the driving motor may be wirelessly transmitted. The plurality of rollers 2c and the shaft 5 provided in the traveling platform 2 form a vertical drive guide which vertically drives the workpiece sucker 3.

The pinion is formed on the outer peripheral portion of each of the plurality of rollers 2b and the plurality of rollers 2c. The pinion formed on each of the plurality of rollers 2b is meshed with the rack (not illustrated) formed on the traveling rail 1. With this structure, the pinion supports a load of the traveling platform 2 and moves the traveling platform 2. The pinion formed on each of the plurality of rollers 2c is meshed with the rack (not illustrated) formed on the shaft 5. Rotation of each of the plurality of rollers 2b moves the traveling platform 2 on the traveling rails 1 in the X-axis direction. Furthermore, the rotation of each of the plurality of rollers 2b is stopped so that the movement of the traveling platform 2 on the traveling rails 1 is stopped. Rotation of each of the plurality of rollers 2c moves the shaft 5 in the Y-axis direction, that is, in the vertical direction. Furthermore, the rotation of each of the plurality of rollers 2c is stopped so that the movement of the shaft 5 in the vertical direction is stopped.

In the fork driver 40, a plurality of rollers 40i for moving the fork driver 40 in the Y-axis direction are provided. In each of the plurality of rollers 40i, a driving motor (not illustrated) is built in. A driving circuit (not illustrated) which controls the driving motor is provided in the fork driver 40. A control signal and electric power used to drive the driving circuit and the driving motor are supplied via a cable (not illustrated). The control signal used to drive the driving circuit and the driving motor may be wirelessly transmitted. A pinion is formed on the outer peripheral portion of each of the plurality of rollers 40i. The pinion formed on each of the plurality of rollers 40i is meshed with a rack (not illustrated) formed on the shaft 5. Rotation of each of the plurality of rollers 40i moves the fork driver 40 in the Y-axis direction, that is, in the vertical direction. Furthermore, the rotation of each of the plurality of rollers 40i is stopped so that the movement of the fork driver 40 in the Y-axis direction is stopped.

In the fork driver 40, a driving member 40j for moving the holder 4a in the X-axis direction and a driving member 40k for moving the holder 4b in the X-axis direction are provided. Furthermore, in the fork driver 40, a driving motor (not illustrated) for driving the driving member 40j and the driving member 40k and a driving circuit (not illustrated) for controlling the driving motor are built in. A control signal and electric power used to drive the driving circuit and the driving motor are supplied via a cable (not illustrated). The control signal used to drive the driving circuit and the driving motor may be wirelessly transmitted. The rotation of the driving motor moves the driving member 40j and the driving member 40k back and forth in the X-axis direction. Furthermore, the rotation of the driving motor is stopped so that the movements of the driving member 40j and the driving member 40k in the X-axis direction are stopped.

The driving member 40j is provided near the one end portion 40b of the fork driver 40. A front end portion of the driving member 40j is fixed to the extending portion 42a of the holder 4a. In a case where the holder 4a is moved away from the workpiece sucker 3, the driving member 40j moves to be projected from the one end portion 40b of the fork driver 40. In a case where the holder 4a is moved to be closer to the workpiece sucker 3, the driving member 40j moves to be housed in the fork driver 40.

The driving member 40k is provided near the other end portion 40c of the fork driver 40. A front end portion of the driving member 40k is fixed to the extending portion 42b of the holder 4b. In a case where the holder 4b is moved away from the workpiece sucker 3, the driving member 40k moves to be projected from the other end portion 40c of the fork driver 40. In a case where the holder 4b is moved to be closer to the workpiece sucker 3, the driving member 40k moves to be housed in the fork driver 40.

That is, by moving the driving member 40j and the driving member 40k, the holder 4a and the holder 4b move to be closer to each other in the X-axis direction, or the holder 4a and the holder 4b move away from each other in the X-axis direction. Hereinafter, a movement of the holder 4a and the holder 4b to be closer to each other in the X-axis direction is referred to as a closing movement, and a movement of the holder 4a and the holder 4b to be away from each other in the X-axis direction is referred to as an opening movement.

The comb-like member 43a and the comb-like member 43b at the time of the closing movement of the hold-ng holder 4a and the holder 4b are moved to positions facing the suction pad 6 provided on the workpiece sucker 3. Furthermore, the comb-like member 43a and the comb-like member 43b at the time of the opening movement of the holder 4a and the holder 4b are moved to positions not facing the other end portion of the workpiece sucker 3 in the Y-axis direction. That is, the comb-like member 43a and the comb-like member 43b at the time of the opening movement of the holder 4a and the holder 4b are moved to be positioned outside a region formed by projecting the workpiece sucker 3 toward the material workpiece or the product workpiece to be described later. With this operation, when the suction pad 6 suctions the material workpiece or the product workpiece to be described later, it is possible to prevent the workpiece sucker 3 moving in the Y-axis direction from interfering with the holder 4a and the holder 4b.

For the traveling rail 1, the workpiece sucker 3, the fork 4, and the fork driver 40, materials such as a galvanized steel sheet, an aluminum alloy, an austenitic stainless steel alloy, a copper alloy, cast iron, steel, or an iron alloy are used. Furthermore, the similar materials are used for a housing forming an outline of the traveling platform 2.

The rollers 2b, the rollers 2c, the rollers 40i, the driving member 40j, and the driving member 40k are in conjunction with each other. Hereinafter, the loading movement of the material workpiece and the unloading movement of the product workpiece by the workpiece conveying device 100 will be described.

The loading movement of the material workplace by the workpiece conveying device 100 will be described with reference to FIGS. 3 to 12. FIGS. 3 to 12 are diagrams for explaining a series of loading movement until a material workpiece 8a extracted from among loaded materials 8 stacked on a material carriage 9 is conveyed on a laser processing machine 13. In FIGS. 3 to 12, the material carriage 9 on which the loaded material 8 is placed and the laser processing machine 13 on which a work support 12 is provided are illustrated. The laser processing machine 13 is a device which performs laser processing on the material workpiece 8a. In the material carriage 9, wheels 10 which enable the movement of the material carriage 9 on the horizontal plane are provided. The wheel 10 moves on a rail 11 installed on a floor surface. The work support. 12 is provided on a top of the laser processing machine 13, and a top of the work support 12 is formed in an uneven shape or a sawtooth shape. The uneven shape or the sawtooth shape is formed by a plurality of projections separated from each other in the Z-axis direction. The plurality of projections is arranged in the X-axis direction and the Z-axis direction. The comb-like member 43a and the comb-like member 43b illustrated in FIG. 2 are inserted into gaps between the projections configuring the work support 12. The reason why the upper portion of the work support 12 is formed in this way is, when a product workpiece 16a placed on the work support 12 is shoveled by the holder 4a and the holder 4b at the time of an unloading movement to be described later, to prevent to damage the product workpiece 16a by creating a gap between the product workpiece 16a and the comb-like member 43a and creating a gap between the product workpiece 16a and the comb-like member 43b.

Figure 3:
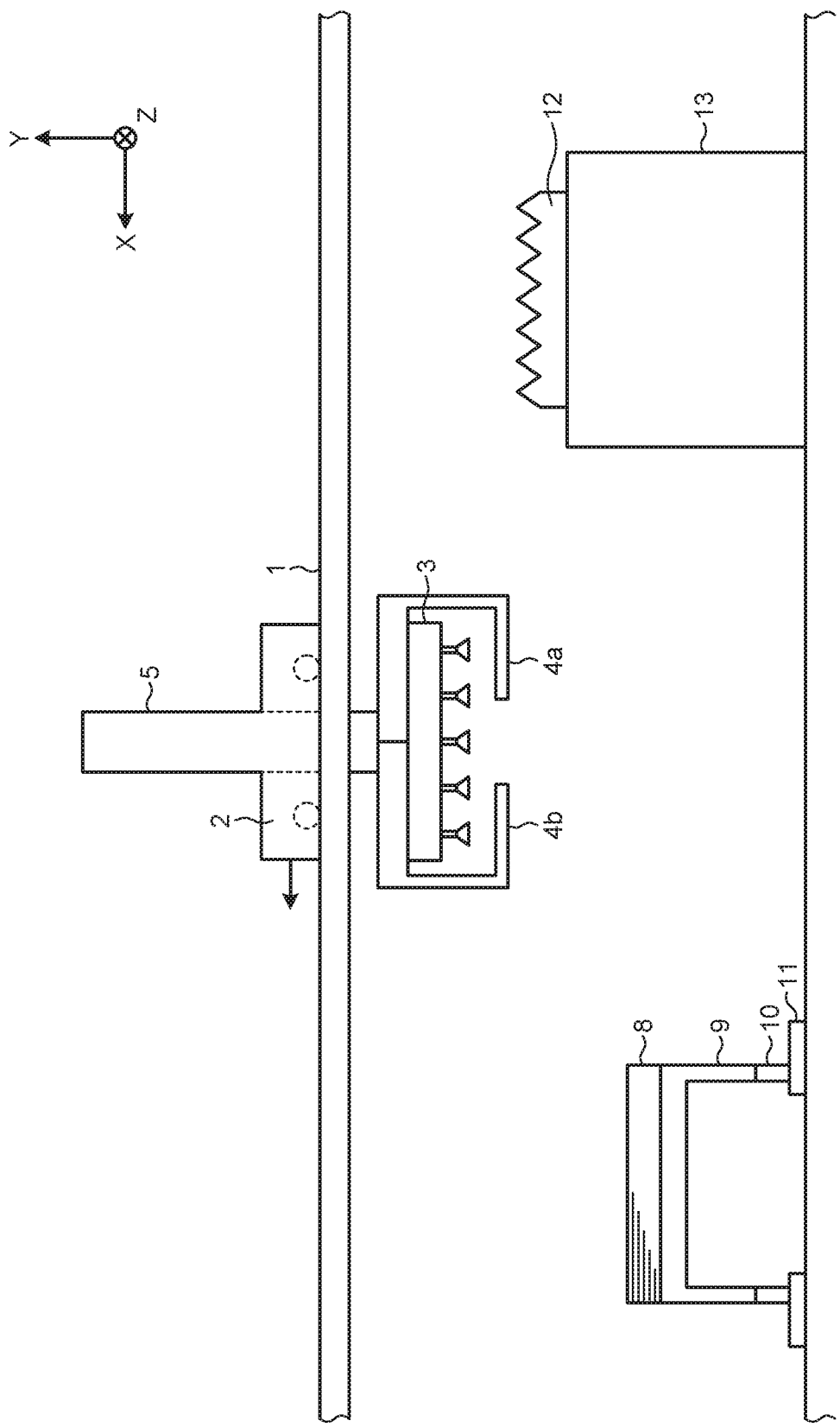
FIG. 3 is a diagram illustrating a state where a traveling platform moves on traveling rails toward a material carriage at the time of a loading movement.

FIG. 3 is a diagram illustrating a state where the traveling platform 2 moves on the traveling rails 1 toward the material carriage 9 at the time of the loading movement. As the rollers 2b illustrated in FIG. 2 rotate, the traveling platform 2 moves on the traveling rails 1 toward the material carriage 9. At this time, the workpiece sucker 3, the holder 4a, and the holder 4b provided on the shaft 5 passing through the traveling platform 2 are integrally moved in the horizontal direction.

Figure 4:
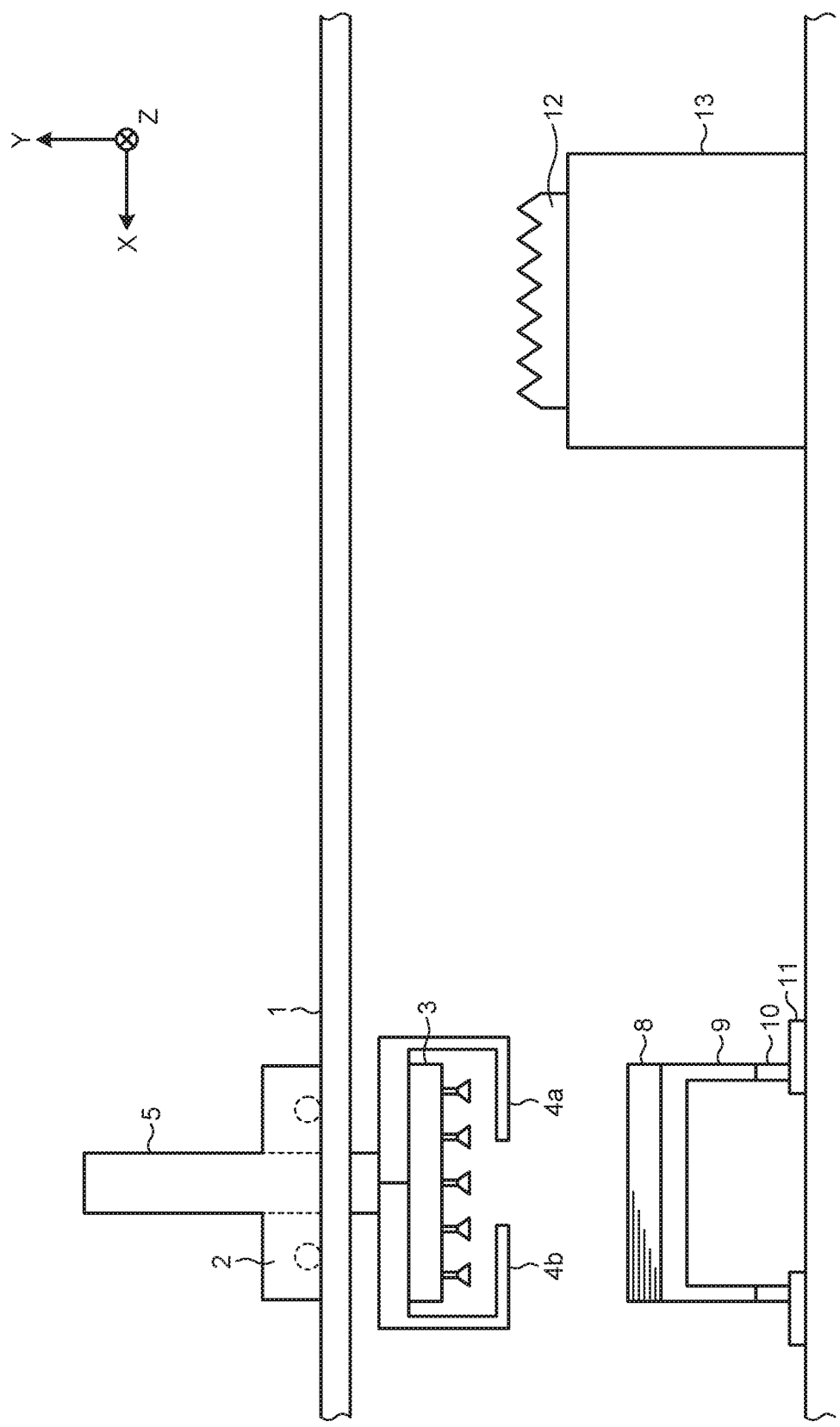
FIG. 4 is a diagram illustrating a state where the traveling platform stops immediately above the material carriage at the time of the loading movement.

FIG. 4 is a diagram illustrating a state where the traveling platform 2 stops immediately above the material carriage 9 at the time of the loading movement. The rotation of the rollers 2b illustrated in FIG. 2 is stopped immediately above the material carriage 9. Since the pinion formed on the roller 2b is meshed with the rack formed on the traveling rail 1, the rotation of the rollers 2b is stopped so that the movement of the traveling platform 2 in the X-axis direction is prevented.

Figure 5:
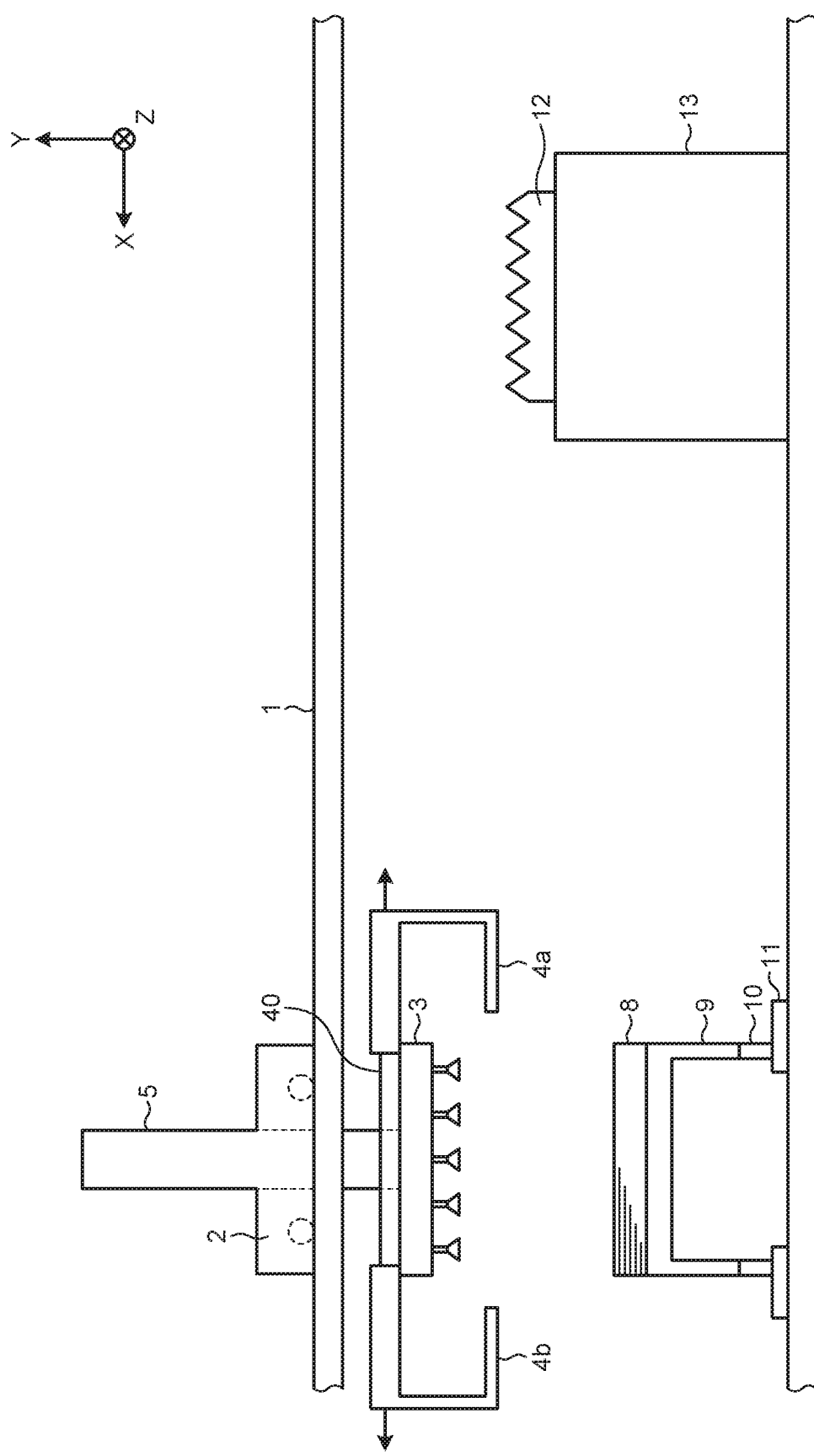
FIG. 5 is a diagram illustrating holders and a state where the holders perform an opening movement before a workpiece sucker descends at the time of the loading movement.

FIG. 5 is a diagram illustrating a state where the holder 4a and the holder 4b perform the opening movement before the workpiece sucker 3 descends at the time of the loading movement. When the holder 4a and the holder 4b perform the opening movement, the rotation of the rollers 4i of the fork driver 40 illustrated in FIG. 2 is stopped. Therefore, the movement of the fork driver 40 in the Y-axis direction is prevented. In this state, by moving the driving member 40j and the driving member 40k illustrated in FIG. 2 to be projected from the fork driver 40, the holder 4a and the holder 4b move to be separated from each other in the X-axis direction.

Figure 6:
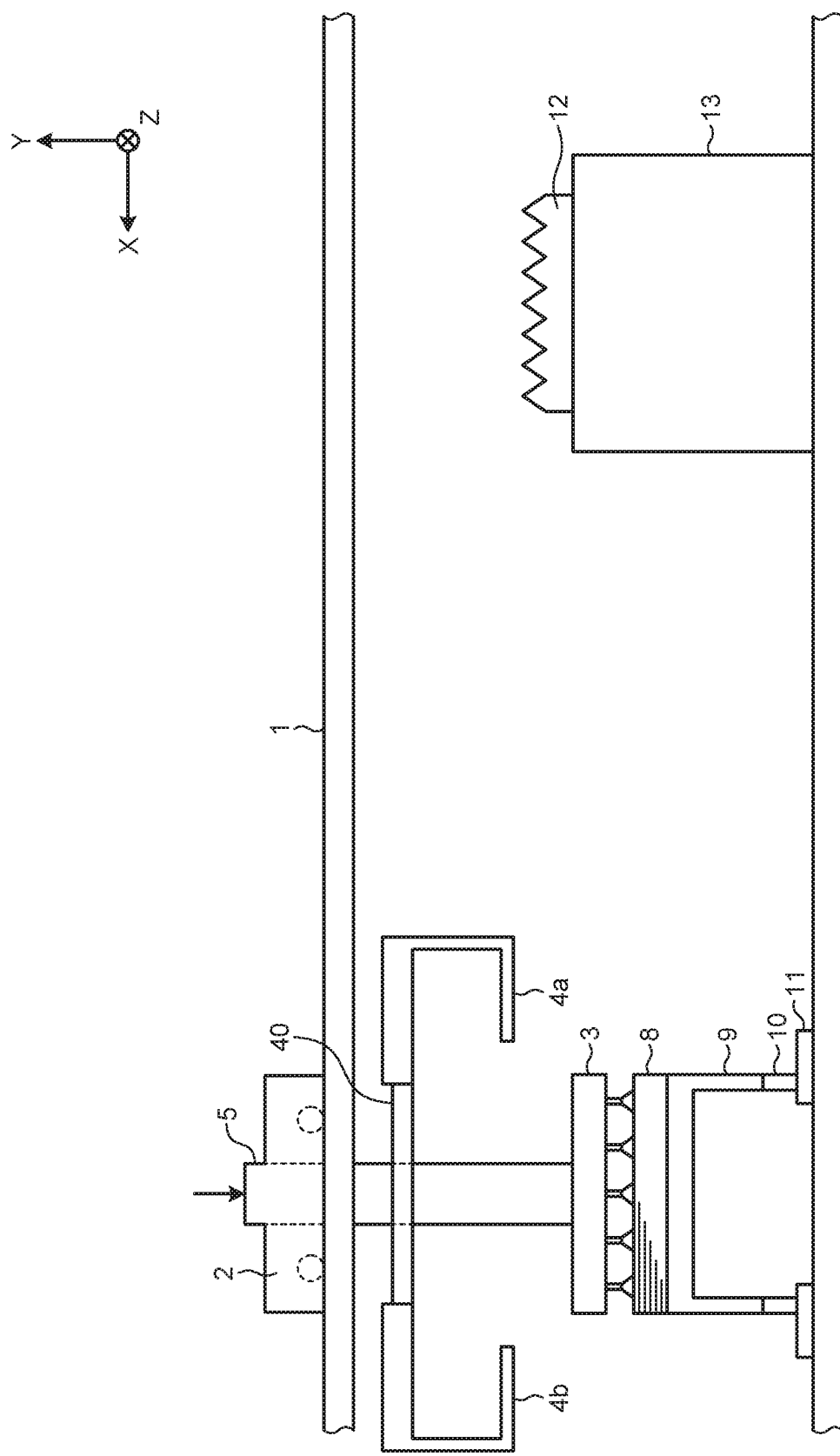
FIG. 6 is a diagram illustrating a state where the descended workpiece sucker sucks a loaded material at the time of the loading movement.

FIG. 6 is a diagram illustrating a state where the descended workpiece sucker 3 sucks the loaded material 8 at the time of the loading movement. As the rollers 2c of the traveling platform 2 illustrated in FIG. 2 rotate the shaft 5 descends. When the shaft 5 descends, the roller 40i of the fork driver 40 illustrated in FIG. 2 rotates in a direction opposite to the rotation of the roller 2c. As a result, the fork driver 40, the holder 4a, and the holder 4b do not descend and stop at a specific position in the Y-axis direction. Therefore, the workpiece sucker 3 independently descends. When the descended workpiece sucker 3 is brought into contact with the loaded material 8, the rotation of the rollers 2c of the traveling platform 2 illustrated in FIG. 2 is stopped. The workpiece sucker 3 extracts a single sheet of the material workpiece positioned at the uppermost position from among the loaded materials 8 stacked on the material carriage 9.

Figure 7:
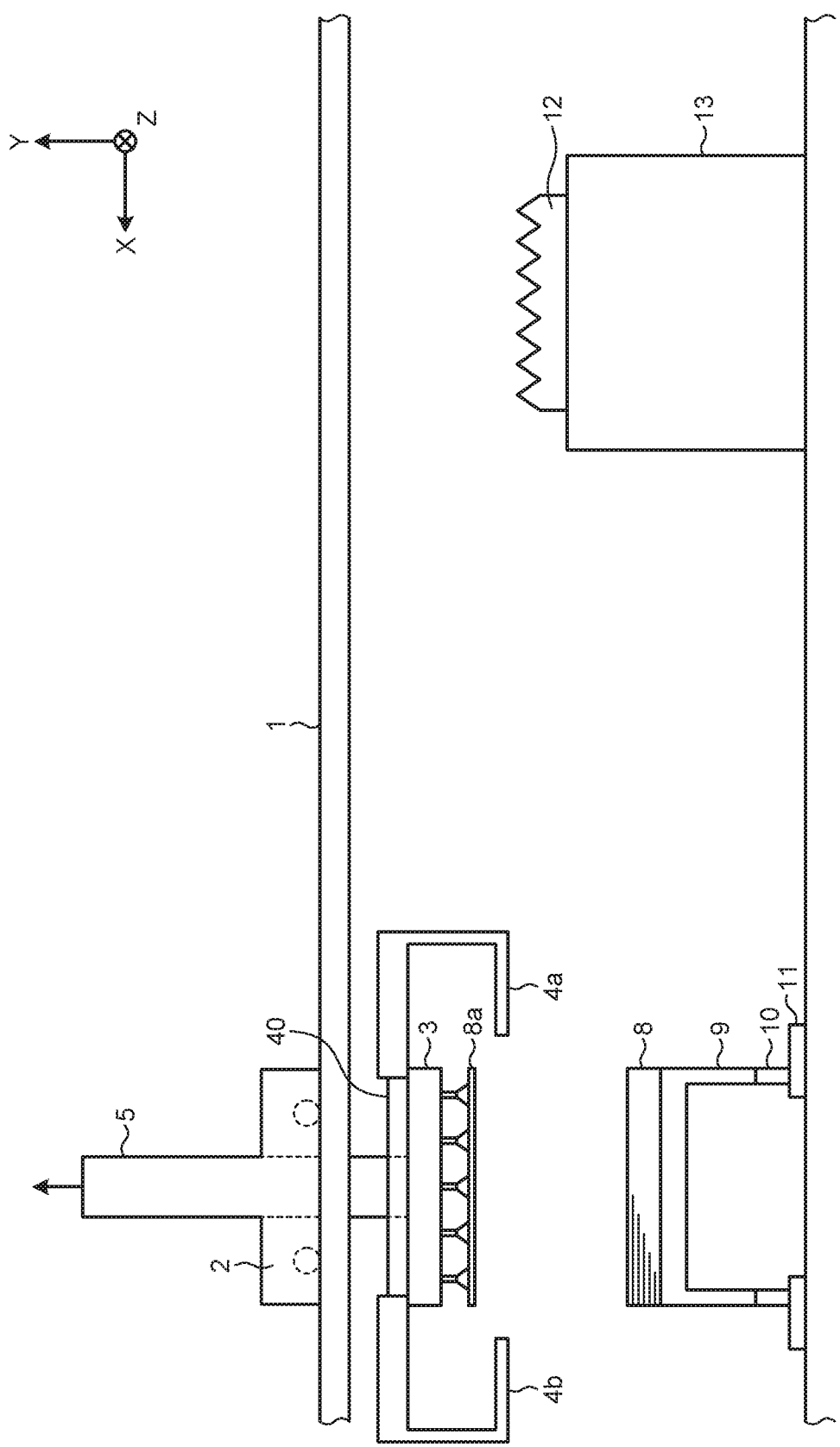
FIG. 7 is a diagram illustrating a state where the workpiece sucker which has extracted a material workpiece is ascending at the time of the loading movement.

FIG. 7 is a diagram illustrating a state where the workpiece sucker 3 which has extracted the material workpiece 8a is ascending at the time of the loading movement. After the workpiece sucker 3 has extracted the material workpiece 8a, as the rollers 2c of the traveling platform 2 illustrated in FIG. 2 rotate, the shaft 5, the workpiece sucker 3, and the material workpiece 8a ascend. At this time, the roller 40 of the fork driver 40 illustrated in FIG. 2 rotates in a direction opposite to the rotation of the roller 2c. As a result, the fork driver 40, the holder 4a, and the holder 4b do not ascend and stop at a specific position in the Y-axis direction. When the ascended workpiece sucker 3 is brought into contact with the fork driver 40, the rotation of the rollers 2c of the traveling platform 2 is stopped.

Figure 8:
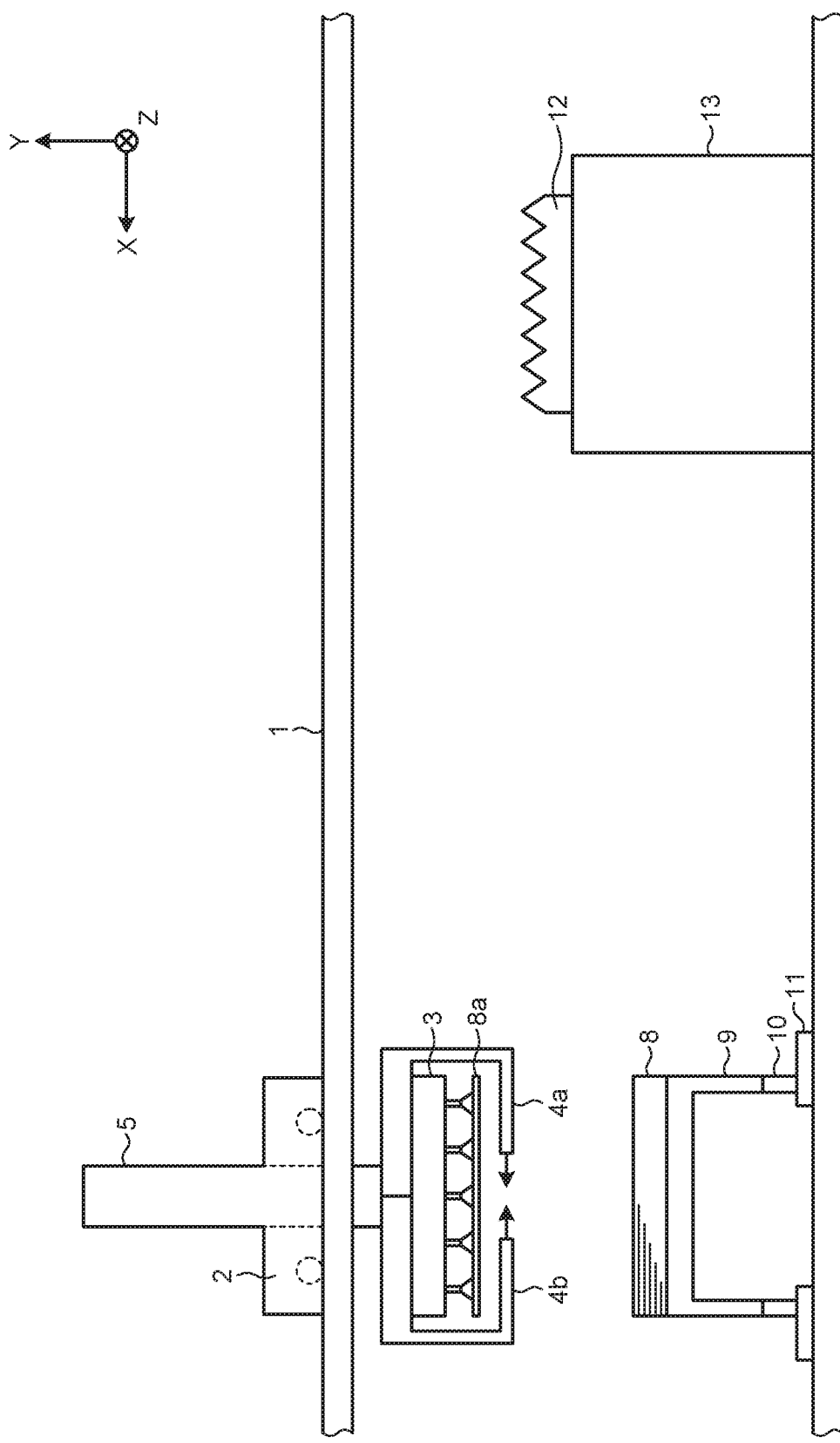
FIG. 8 is a diagram illustrating holders and a state where the holders perform a closing movement at the time of the loading movement.

FIG. 8 is a diagram illustrating a state where the holder 4a and the holder 4b perform the closing movement at the time of the loading movement. By moving the driving member 40j and the driving member 40k illustrated in FIG. 2 to be housed in the fork driver 40 in a state where the rotation of the rollers 2c of the traveling platform 2 is stopped, the holder 4a and the holder 4b move to be closer to each other in the X-axis direction. In FIG. 8, the holder 4a and the holder 4b are closed to prevent drop of the material workpiece 8a being conveyed. However, since the material workpiece 8a is sucked by the workpiece sucker 3, the holder 4a and the holder 4b may be a state of being opened.

Figure 9:
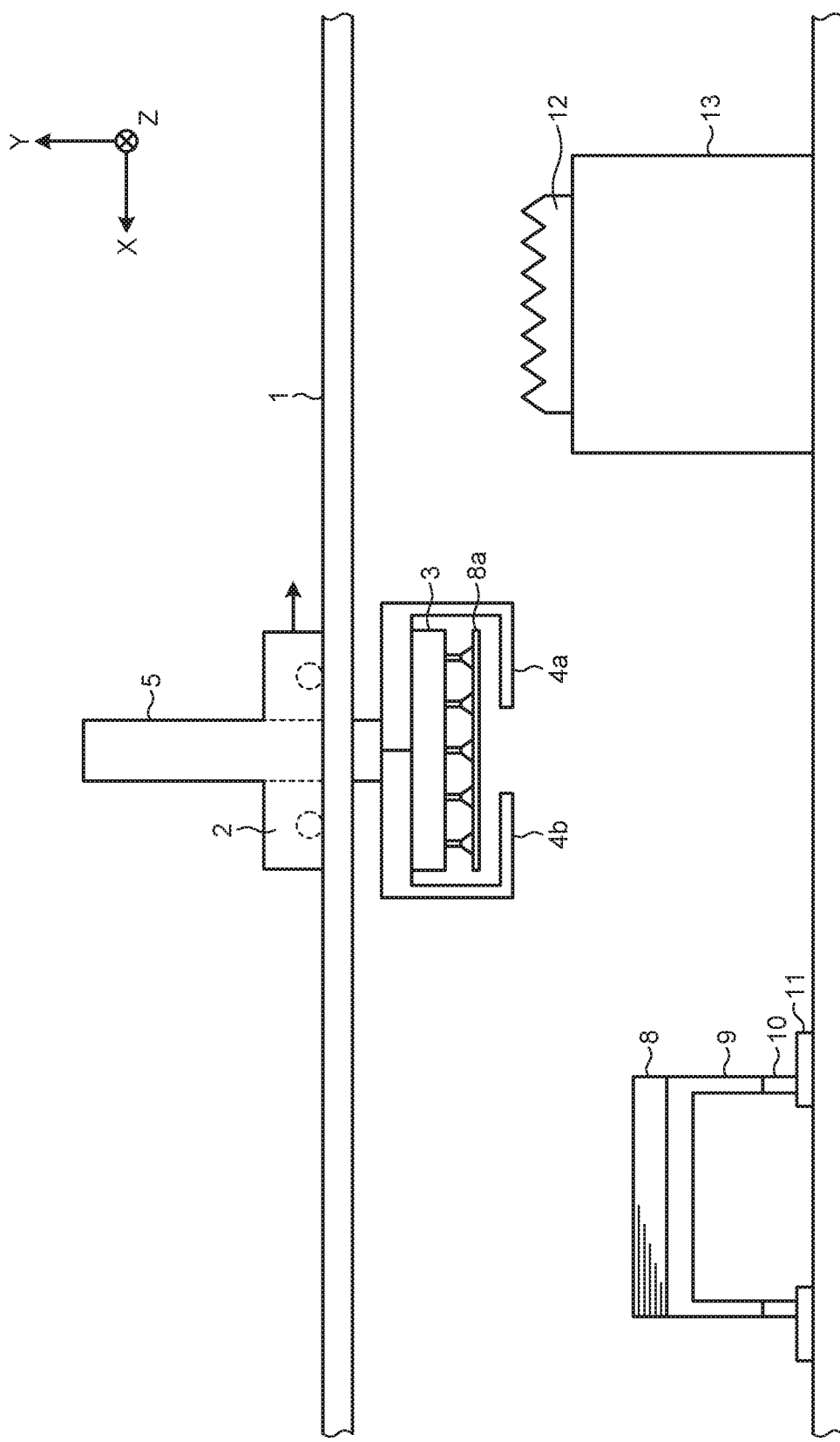
FIG. 9 is a diagram illustrating a state where the traveling platform moves on the traveling rails toward a laser processing machine at the time of the loading movement.

FIG. 9 is a diagram illustrating a state where the traveling platform 2 moves on the traveling rails 1 toward the laser processing machine 13 at the time of the loading movement. As the rollers 2b illustrated in FIG. 2 rotate, the traveling platform 2 moves on the traveling rails 1 toward the laser processing machine 13. At this time, in a state of sucking the material workpiece 8a, the workpiece sucker 3 provided on the shaft 5 is integrally moved with the holder 4a and the holder 4b in the horizontal direction.

Figure 10:
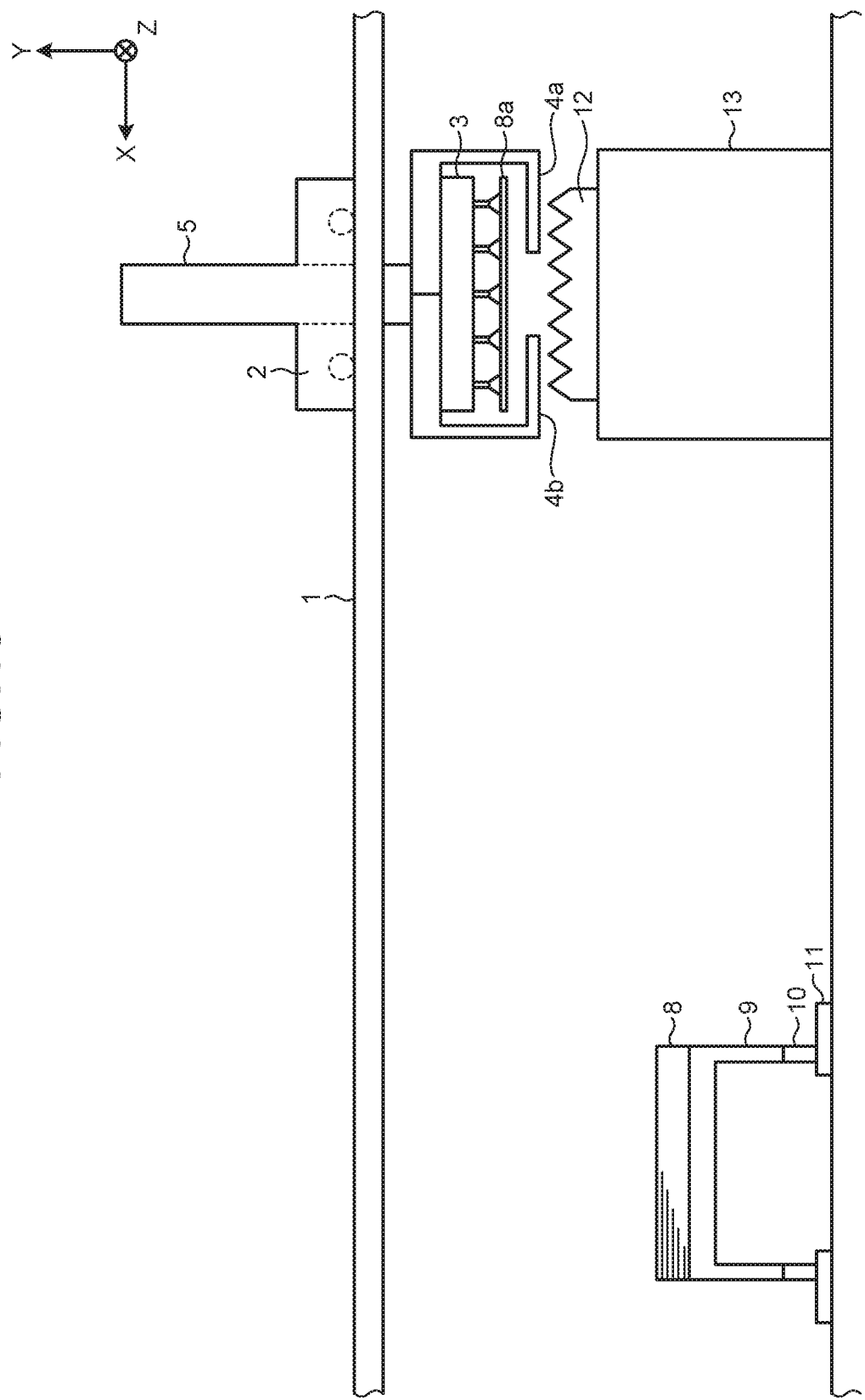
FIG. 10 is a diagram illustrating a state where the traveling platform stops immediately above the laser processing machine at the time of the loading movement.

FIG. 10 is a diagram illustrating a state where the traveling platform 2 stops immediately above the laser processing machine 13 at the time of the loading movement. The rotation of the rollers 2b illustrated in FIG. 2 is stopped immediately above the laser processing machine 13. Since the pinion formed on the roller 2b is meshed with the rack formed on the traveling rail 1, the rotation of the rollers 2b is stopped so that the movement of the traveling platform 2 in the X-axis direction is prevented.

Figure 11:
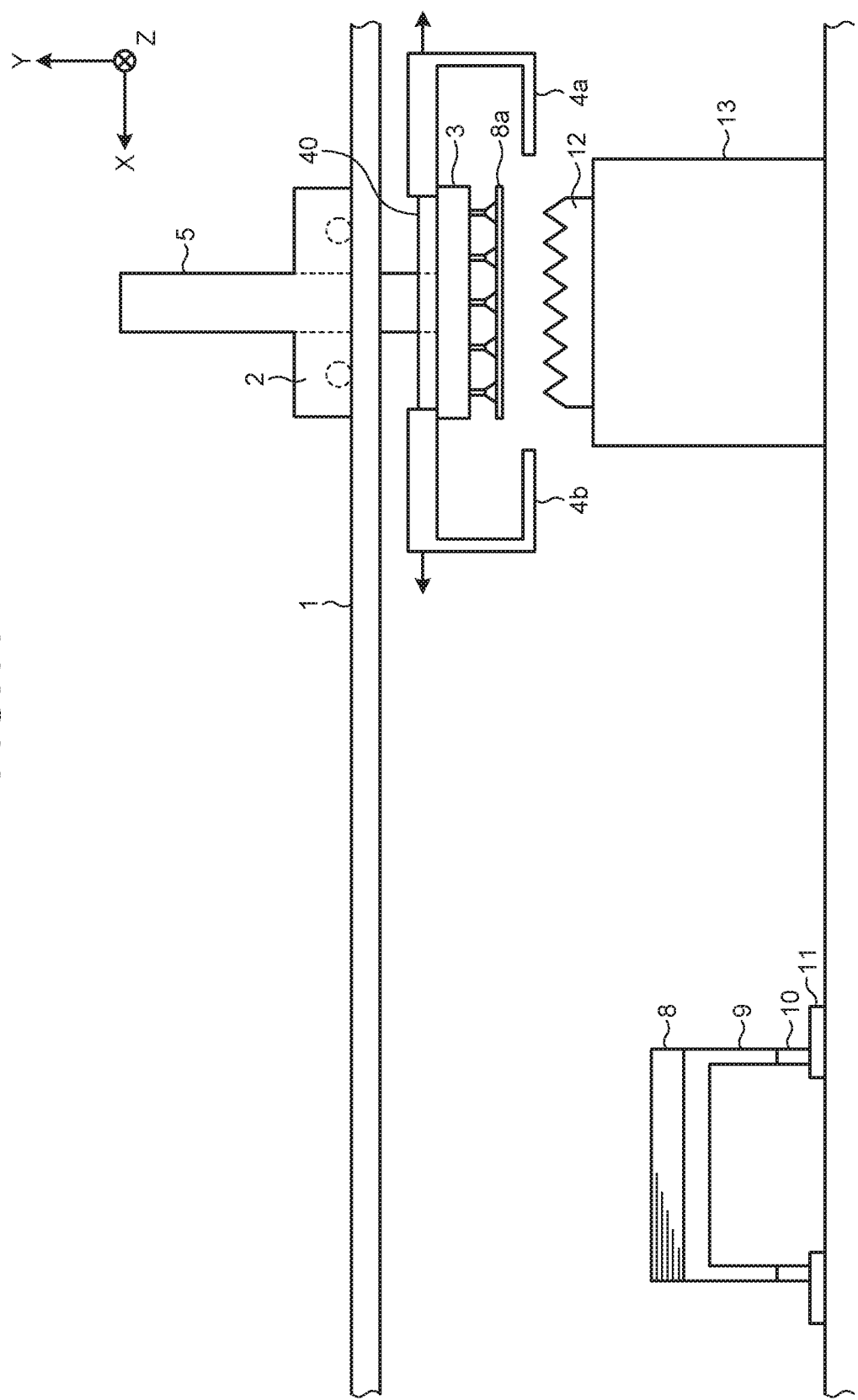
FIG. 11 is a diagram illustrating holders and a state where the holders perform the opening movement before the workpiece sucker descends at the time of the loading movement.

FIG. 11 is a diagram illustrating a state where the holder 4a and the holder 4b perform the opening movement before the workpiece sucker 3 descends at the time of the loading movement. When the holder 4a and the holder 4b perform the opening movement, the rotation of the rollers 40i of the fork driver 40 illustrated in FIG. 2 is stopped. Therefore, the movement of the fork driver 40 in the Y-axis direction is prevented. In this state, by moving the driving member 40j and the driving member 40k illustrated in FIG. 2 to be projected from the fork driver 40, the holder 4a and the holder 4b move to be separated from each other in the X-axis direction.

Figure 12:
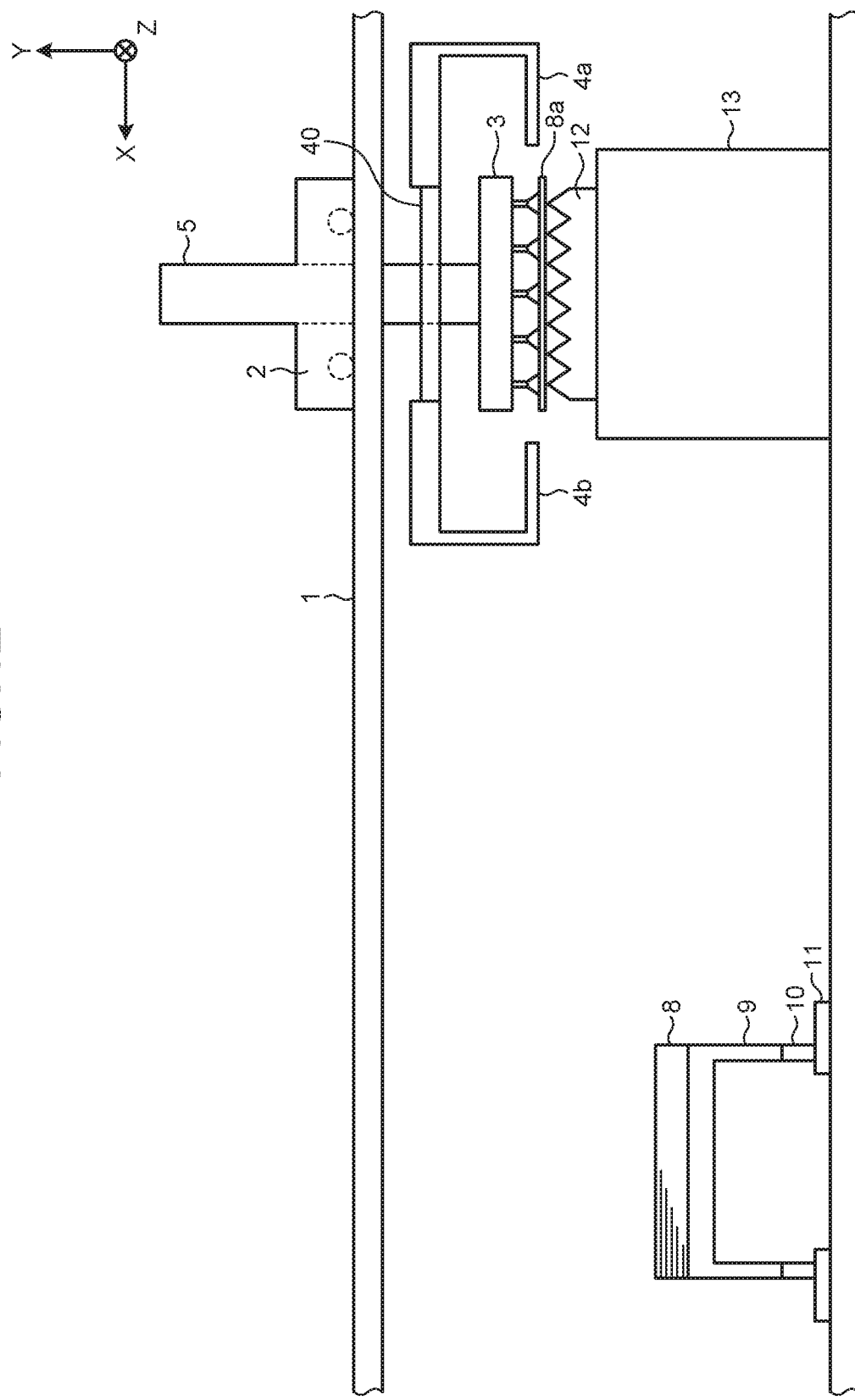
FIG. 12 is a diagram illustrating a state where the material workpiece sucked by the descended workpiece sucker is placed on a work support at the time of the loading movement.

FIG. 12 is a diagram illustrating a state where the material workpiece 8a sucked by the descended workpiece sucker 3 is placed on the work support 12 at the time of the loading movement. As the rollers 2c of the traveling platform 2 illustrated in FIG. 2 rotate, the shaft 5 descends. When the shaft 5 descends, the roller 40i of the fork driver 40 illustrated in FIG. 2 rotates in a direction opposite to the rotation of the roller 2c. As a result, the fork driver 40, the holder 4a, and the holder 4b do not descend and stop at a specific position in the Y-axis direction. Therefore, the workpiece sucker 3 independently descends. When the material workpiece 8a sucked by the descended workpiece sucker 3 is brought into contact with the work support 12, the rotation of the rollers 2c of the traveling platform 2 illustrated in FIG. 2 is stopped so that the material workpiece 8a is released from the workplace sucker 3. As described above, after the loading movement of the material workpiece 8a has been completed and the workpiece sucker 3, the holder 4a, and the holder 4b have been ascended, the laser processing machine 13 starts laser processing.

An unloading movement of the product workplace 16a by the workpiece conveying device 100 will be described below with reference to FIGS. 13 to 22. FIGS. 13 to 22 are diagrams for explaining a series of unloading movement until the product workpiece 16a placed on the work support 12 is conveyed on a product carriage 17. FIGS. 13 to 22 illustrate: the material carriage 9 on which the loaded material 8 is placed; the product carriage 17 placed so as to surround outside of the mater al carriage 9; a power storage controlling unit 16 placed on the product carriage 17; the laser processing machine 13 on which the work support 12 provided; and the product workpiece 16a placed on the work support 12. In the product carriage 17, the wheels 10 which enable movement of the product carriage 17 on the horizontal plane are provided.

Figure 13:
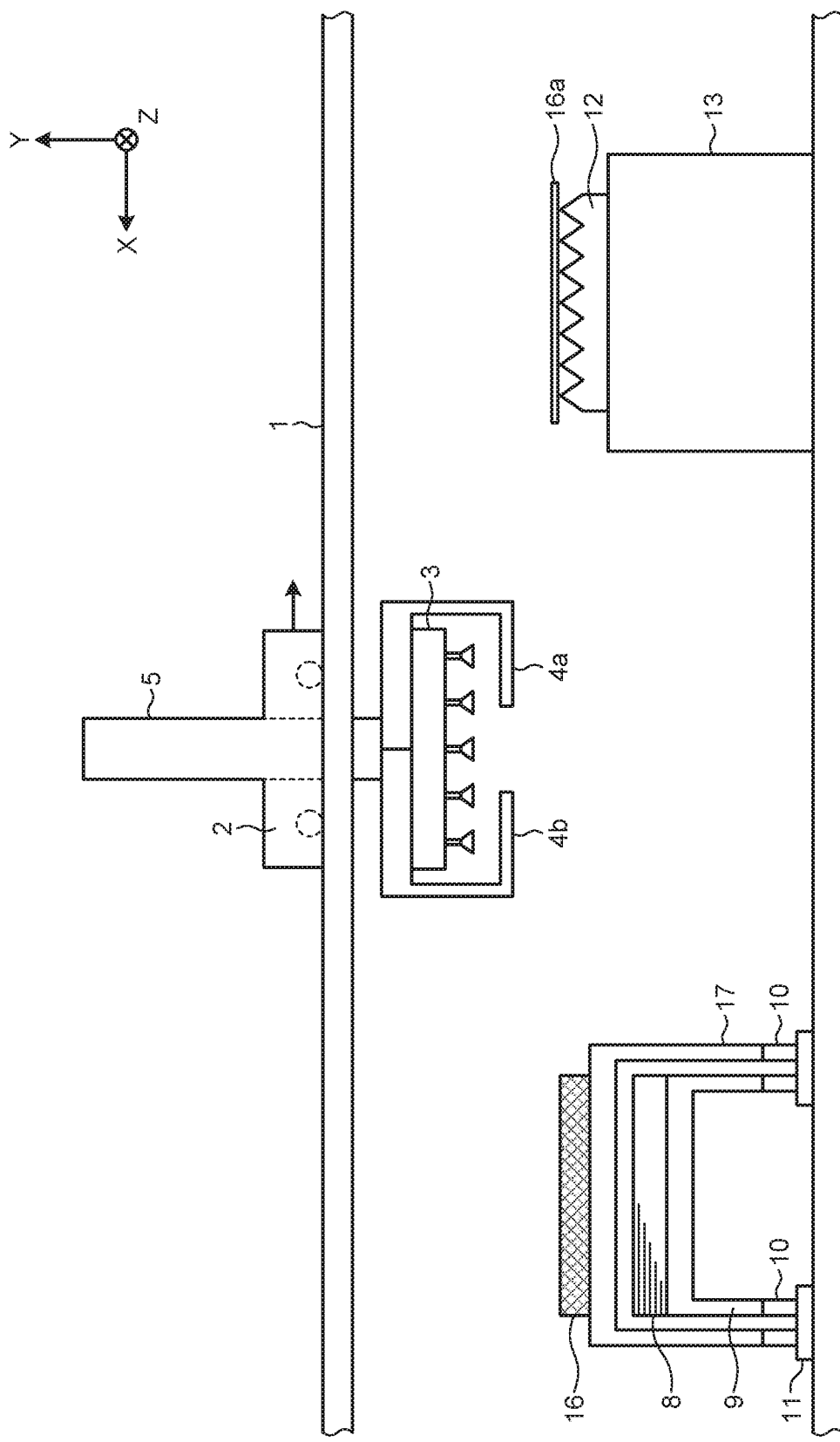
FIG. 13 is a diagram illustrating a state where the traveling platform moves on the traveling rails at the time of an unloading movement.

FIG. 13 is a diagram illustrating a state where the traveling platform 2 moves on the traveling rails 1 at the time of the unloading movement. As the rollers 2b illustrated in FIG. 2 rotate, the traveling platform 2 moves on the traveling rails 1 toward the laser processing machine 13. At this time, the workpiece sucker 3, the holder 4a, and the holder 4b provided on the shaft 5 passing through the traveling platform 2 are integrally moved in the horizontal direction.

Figure 14:
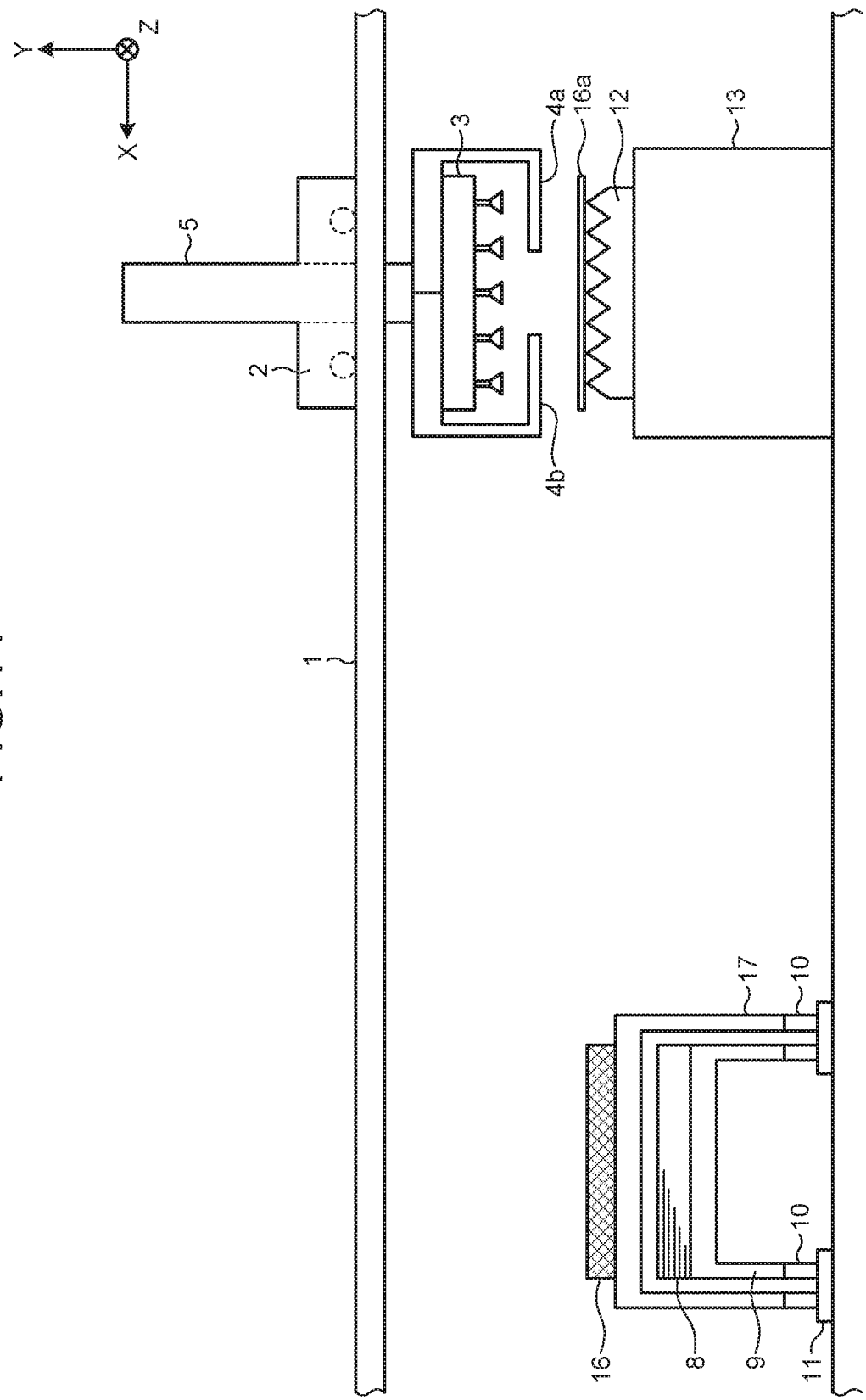
FIG. 14 is a diagram illustrating a state where the traveling platform stops immediately above the laser processing machine at the time of the unloading movement.

FIG. 14 is a diagram illustrating a state where the traveling platform 2 stops immediately above the laser processing machine 13 at the time of the unloading movement. The rotation of the rollers 2b illustrated in FIG. 2 is stopped immediately above the laser processing machine 13. Since the pinion formed on the roller 2b is meshed with the rack formed on the traveling rail 1, the rotation of the rollers 2b is stopped so that the movement of the traveling platform 2 in the X-axis direction is prevented.

Figure 15:
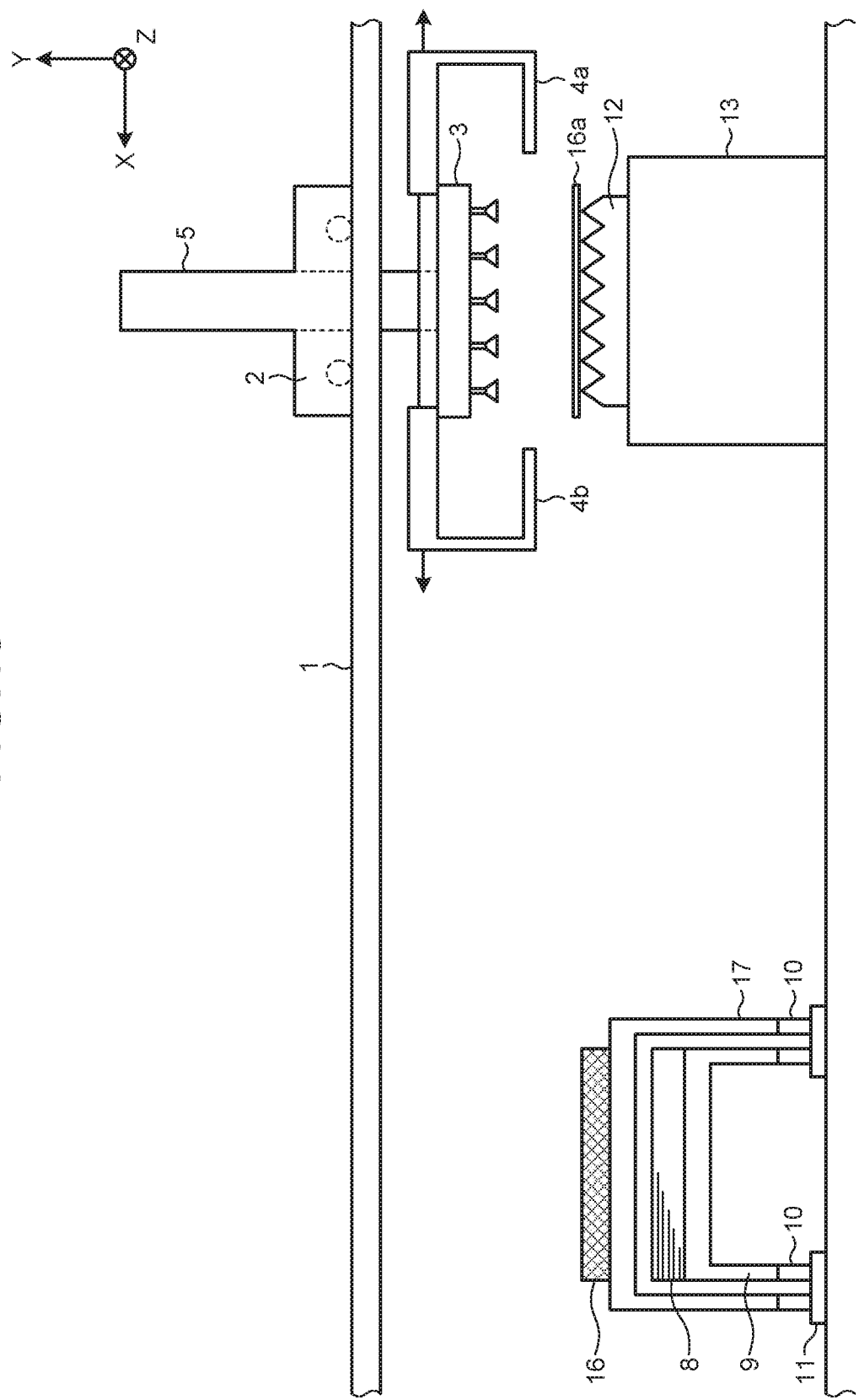
FIG. 15 is a diagram illustrating holders and a state where the holders perform the opening movement before the workpiece sucker descends at the time of the unloading movement.

FIG. 15 is a diagram illustrating a state where the holder 4a and the holder 4b perform the opening movement before the workpiece sucker 3 descends at the time of the unloading movement. When the holder 4a and the holder 4b perform the opening movement, the rotation of the rollers 40i of the fork driver 40 illustrated in FIG. 2 is stopped. Therefore, the movement of the fork driver 40 in the Y-axis direction is prevented. In this state, by moving the driving member 40j and the driving member 40k illustrated in FIG. 2 to be projected from the fork driver 40, the holder 4a and the holder 4b move to be separated from each other in the X-axis direction.

Figure 16:
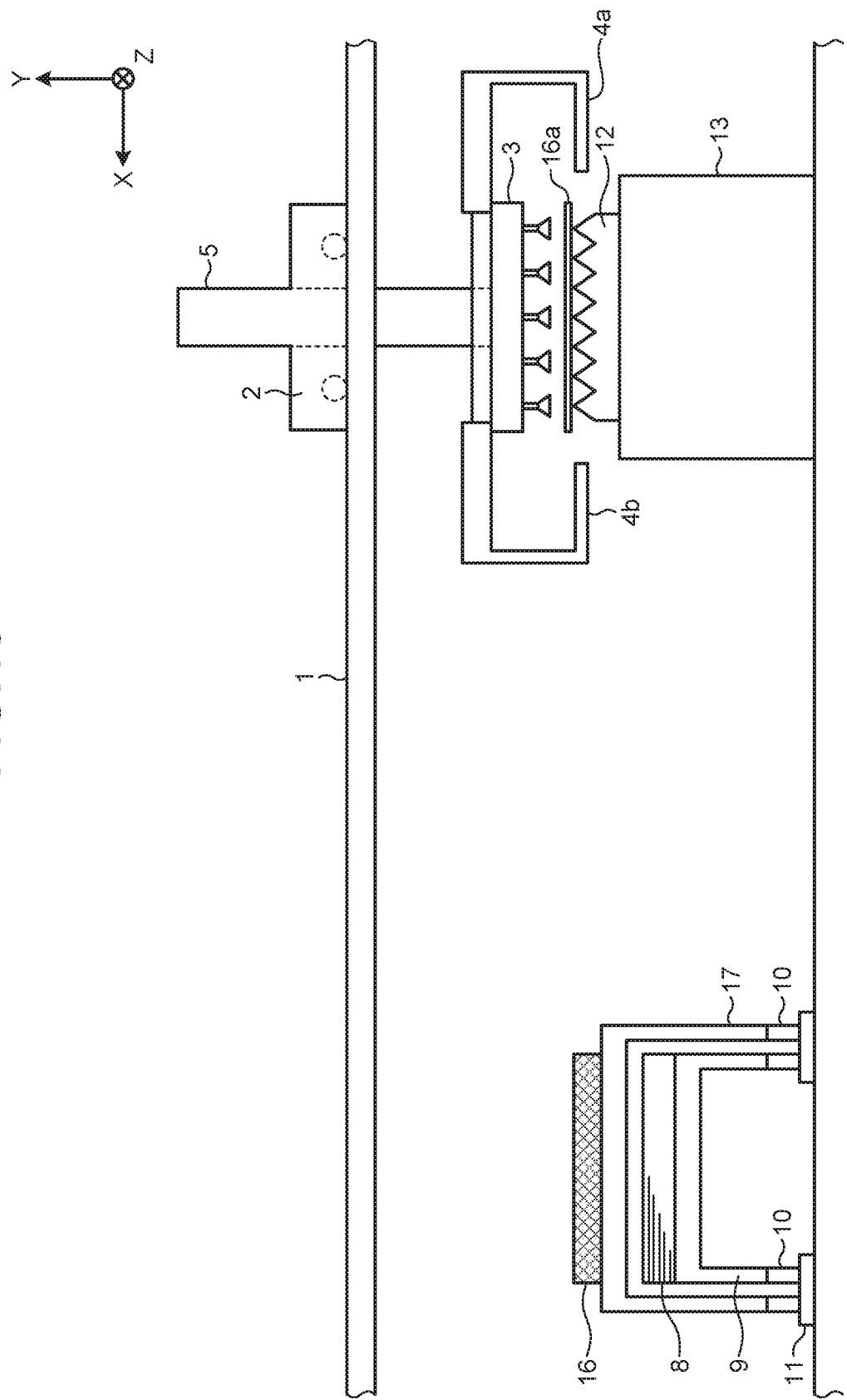
FIG. 16 is a diagram illustrating holders and a state before the descended holders hold a product workpiece at the time of the unloading movement.

FIG. 16 is a diagram illustrating a state before the descended holder 4a and holder 4b hold the product workpiece 16a at the time of the unloading movement. As the rollers 2c of the traveling platform 2 illustrated in FIG. 2 rotate, the shaft 5 descend. At this time, the rotation of the rollers 40i of the fork driver 40 illustrated in FIG. 2 is stopped. Therefore, the fork driver 40, the holder 4a, the holder 4b, and the workpiece sucker 3 integrally descend. When the holder 4a and the holder 4b reach a position slightly lower than the lower surface of the product workpiece 16a, the rotation of the rollers 2c of the traveling platform 2 illustrated in FIG. 2 is stopped.

Figure 17:
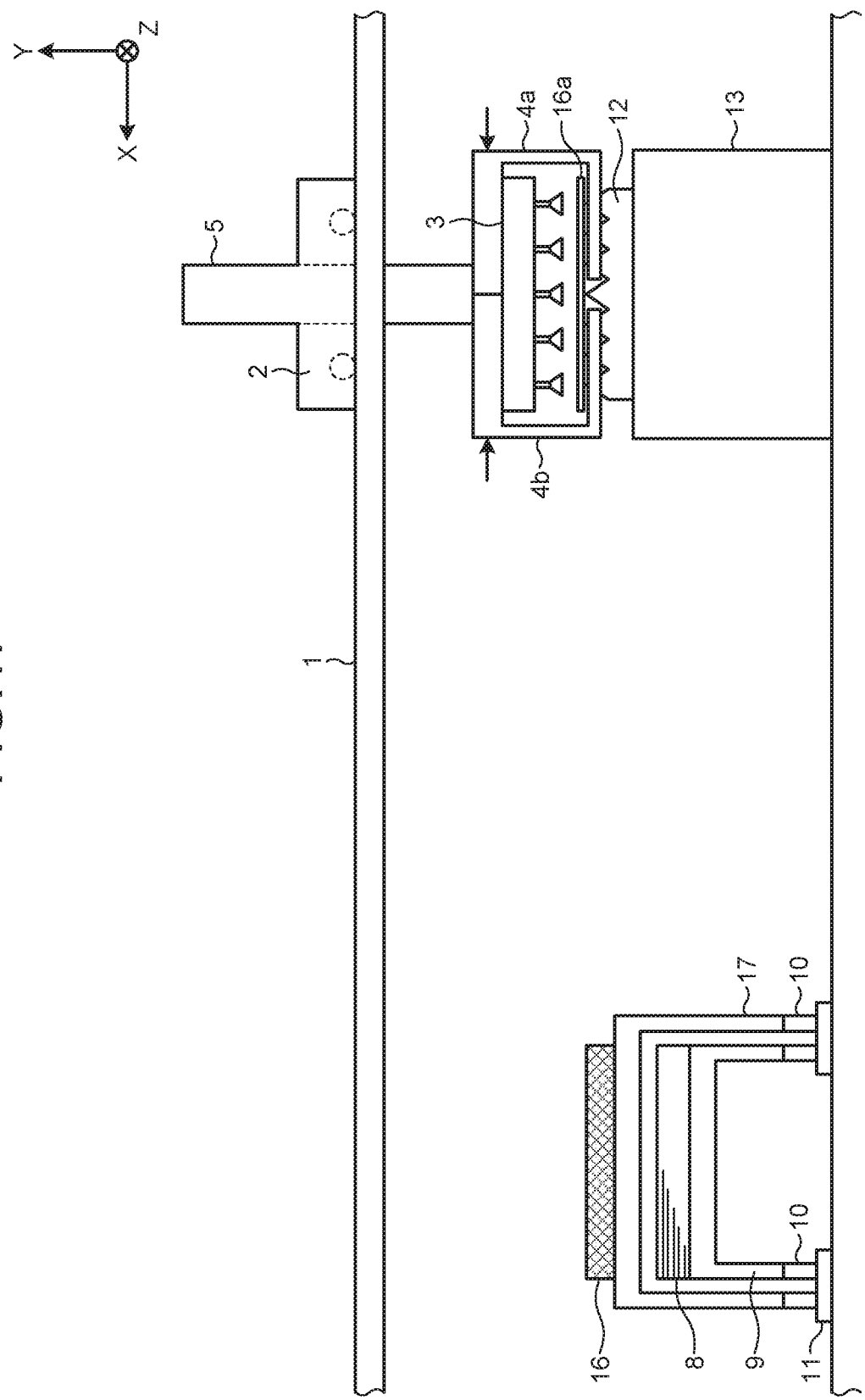
FIG. 17 is a diagram illustrating holders and a state where the holders perform the closing movement to hold the product workpiece at the time of the unloading movement.

FIG. 17 is a diagram illustrating a state where the holder 4a and the holder 4b perform the closing movement to hold the product workpiece 16a at the time of the unloading movement. As the driving member 40j and the driving member 40k illustrated in FIG. 2 move to be housed in the fork driver 40, the holder 4a and the holder 4b move to be closer to each other in the X-axis direction. Here, as described above, the comb-like member 43a and the comb-like member 43b illustrated in FIG. 2 can be inserted into the gaps between the projections formed on the work support 12. Therefore, at the time of the closing movement of the holder 4a and the holder 4b, the comb-like member 43a and the comb-like member 43b are inserted below the product workpiece 16a without interfering with the product workpiece 16a. As a result, the product workpiece 16a is held by the holder 4a and the holder 4b.

Figure 18:
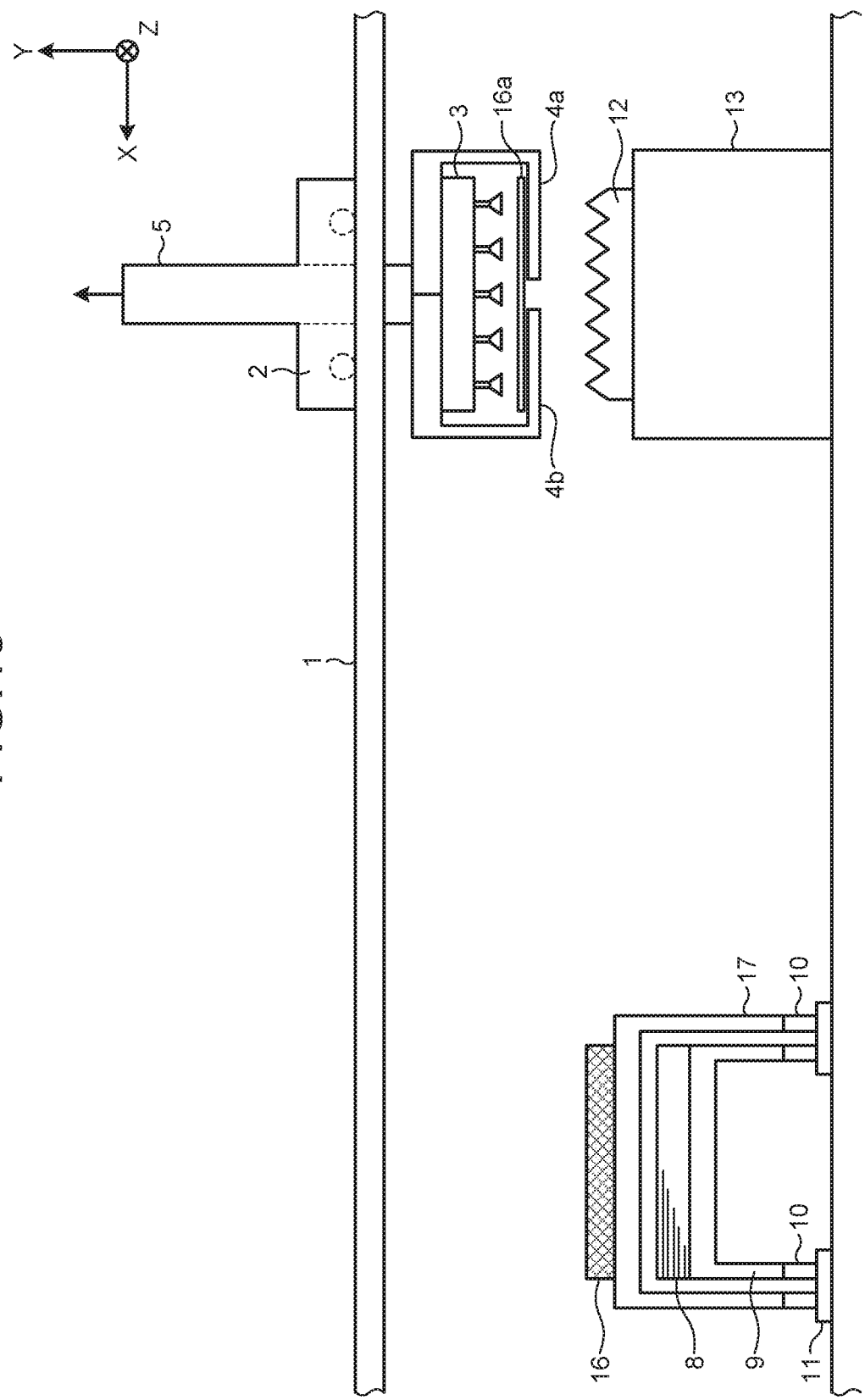
FIG. 18 is a diagram illustrating holders and a state where the holders holding the product workpiece are ascending at the time of the unloading movement.

FIG. 18 is a diagram illustrating a state where the holder 4a and the holder 4b holding the product workpiece 16a are ascending at the time of the unloading movement. After the holder 4a and the holder 4b have performed the closing movement, as the rollers 2c of the traveling platform 2 illustrated in FIG. 2 rotate, the shaft 5, the workpiece sucker 3, the holder 4a, and the holder 4b integrally ascend in a state where the holder 4a and the holder 4b holding the product workpiece 16a.

Figure 19:
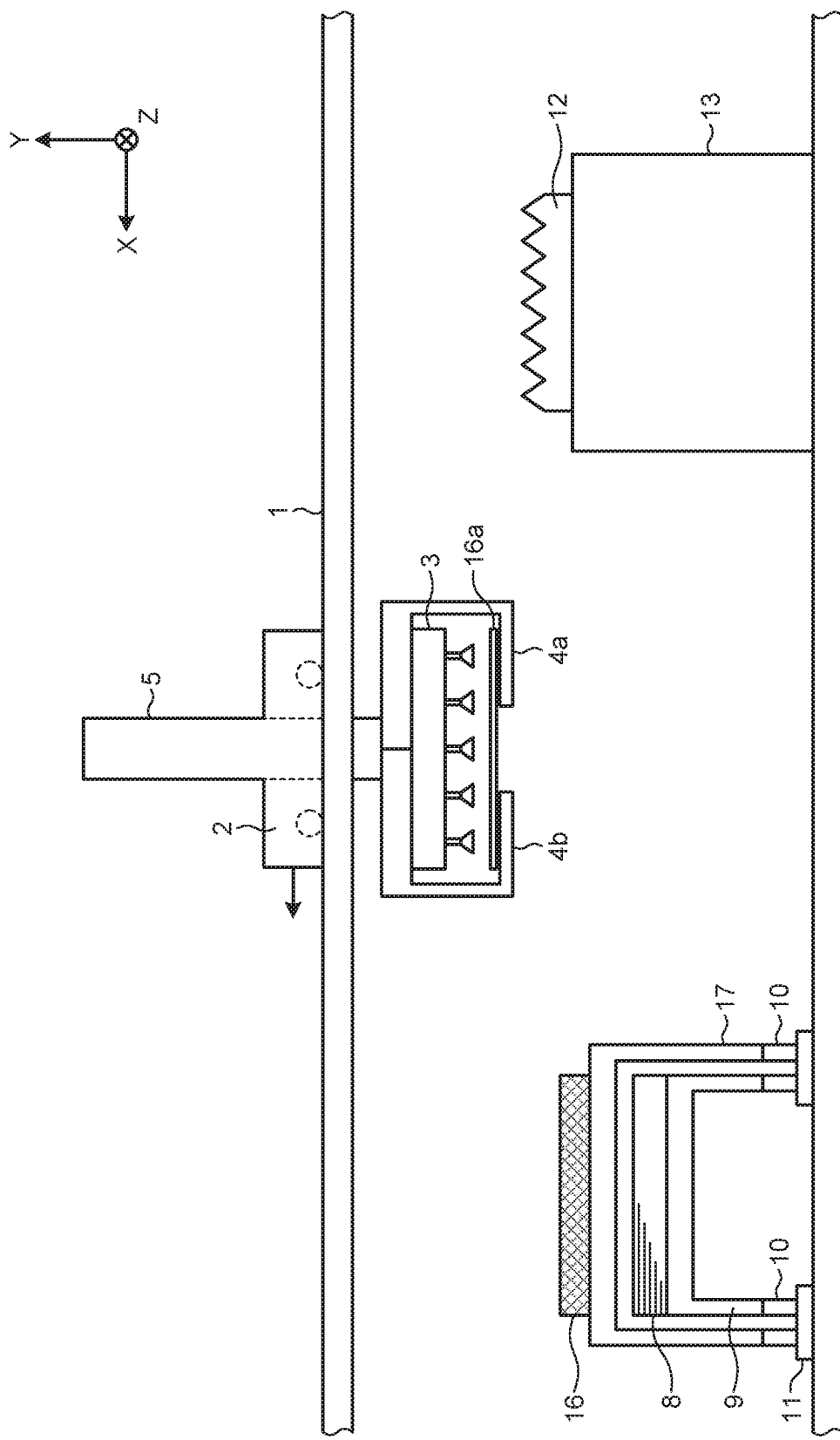
FIG. 19 is a diagram illustrating a state where the traveling platform moves on the traveling rails toward a product carriage at the time of the unloading movement.

FIG. 19 is a diagram illustrating a state where the traveling platform 2 moves on the traveling rails 1 toward the product carriage 17 at the time of the unloading movement. As the rollers 2b illustrated in FIG. 2 rotate, the traveling platform 2 moves on the traveling rails 1 toward the product carriage 17. At this time, in a state of holding the product workpiece 16a, the holder 4a and the holder 4b horizontally move integrally with the shaft 5 and the workpiece sucker 3.

Figure 20:
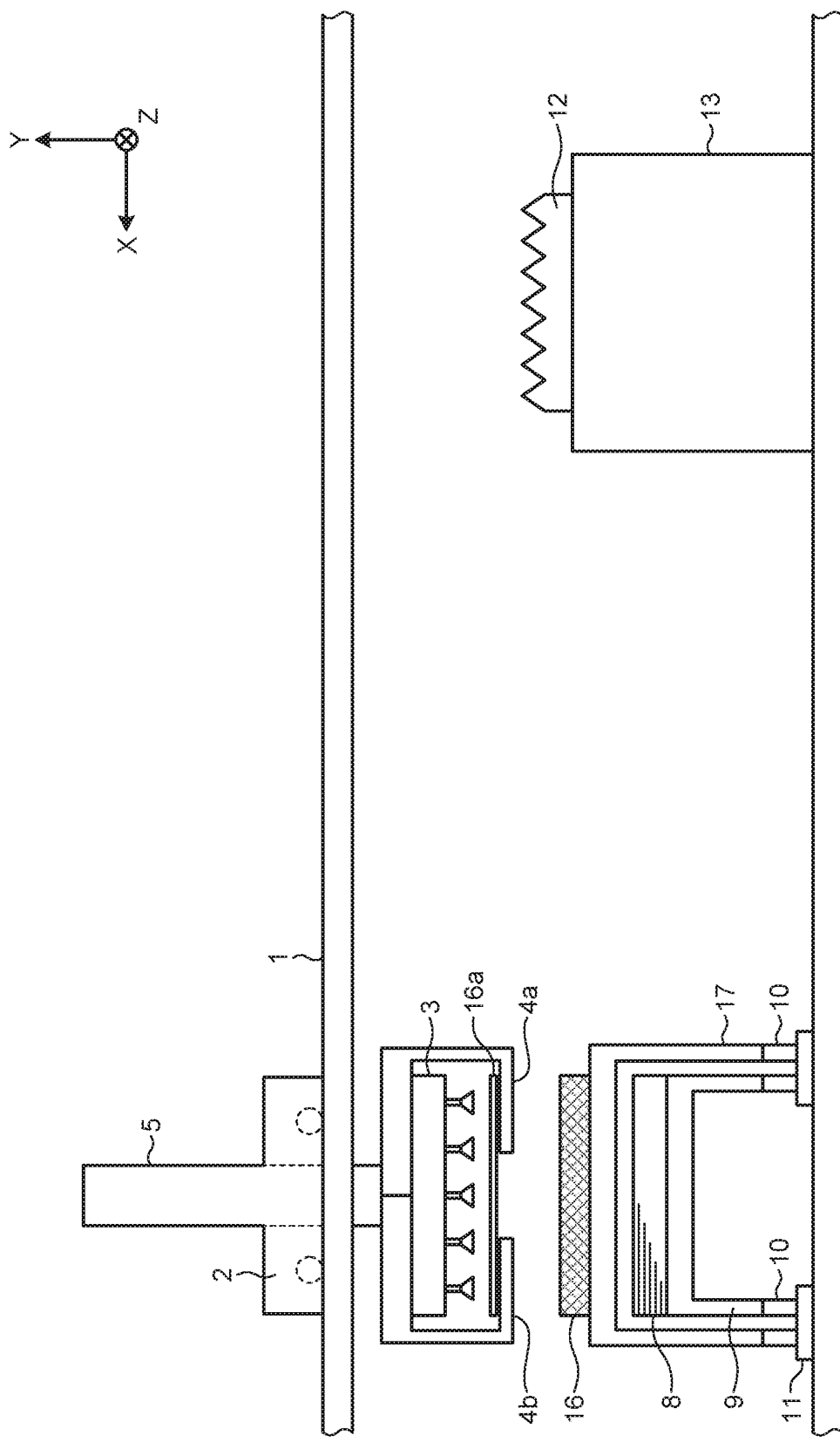
FIG. 20 is a diagram illustrating a state where the traveling platform stops immediately above the product carriage at the time of the unloading movement.

FIG. 20 is a diagram illustrating a state where the traveling platform 2 stops immediately above the product carriage 17 at the time of the unloading movement. The rotation of the rollers 2b illustrated in FIG. 2 is stopped immediately above the product carriage 17. Since the pinion formed on the roller 2b is meshed with the rack formed on the traveling rail 1, the rotation of the rollers 2b is stopped so that the movement of the traveling platform 2 in the X-axis direction is prevented.

Figure 21:
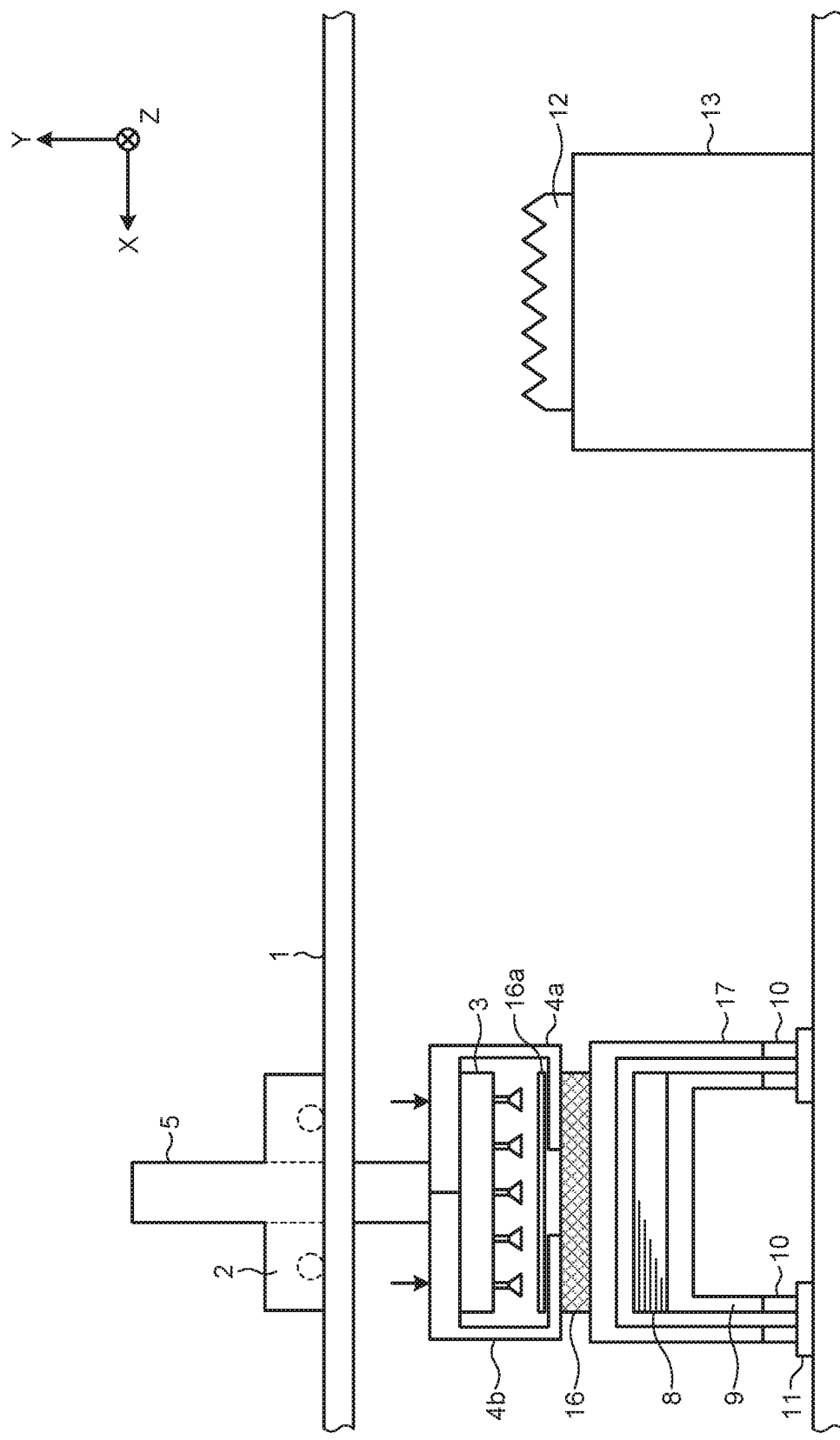
FIG. 21 is a diagram illustrating holders and a state before the holders which have descended integrally with the workpiece sucker and a shaft perform the opening movement at the time of the unloading movement.

FIG. 21 is a diagram illustrating a state before the holder 4a and the holder 4W which have descended integrally with the workpiece sucker 3 and the shaft 5 perform the opening movement at the time of the unloading movement. As the rollers 2c of the traveling platform 2 illustrated in FIG. 2 rotate, the shaft 5 descends. When the shaft 5 descends, the rotation of the rollers 40i of the fork driver 40 illustrated in FIG. 2 is stopped. Immediately before the descended holder 4a and holder 4b are brought into contact with the power storage controlling unit 16 provided on the upper side of the product carriage 17, the rotation of the rollers 2c of the traveling platform 2 illustrated in FIG. 2 is stopped.

Figure 22:
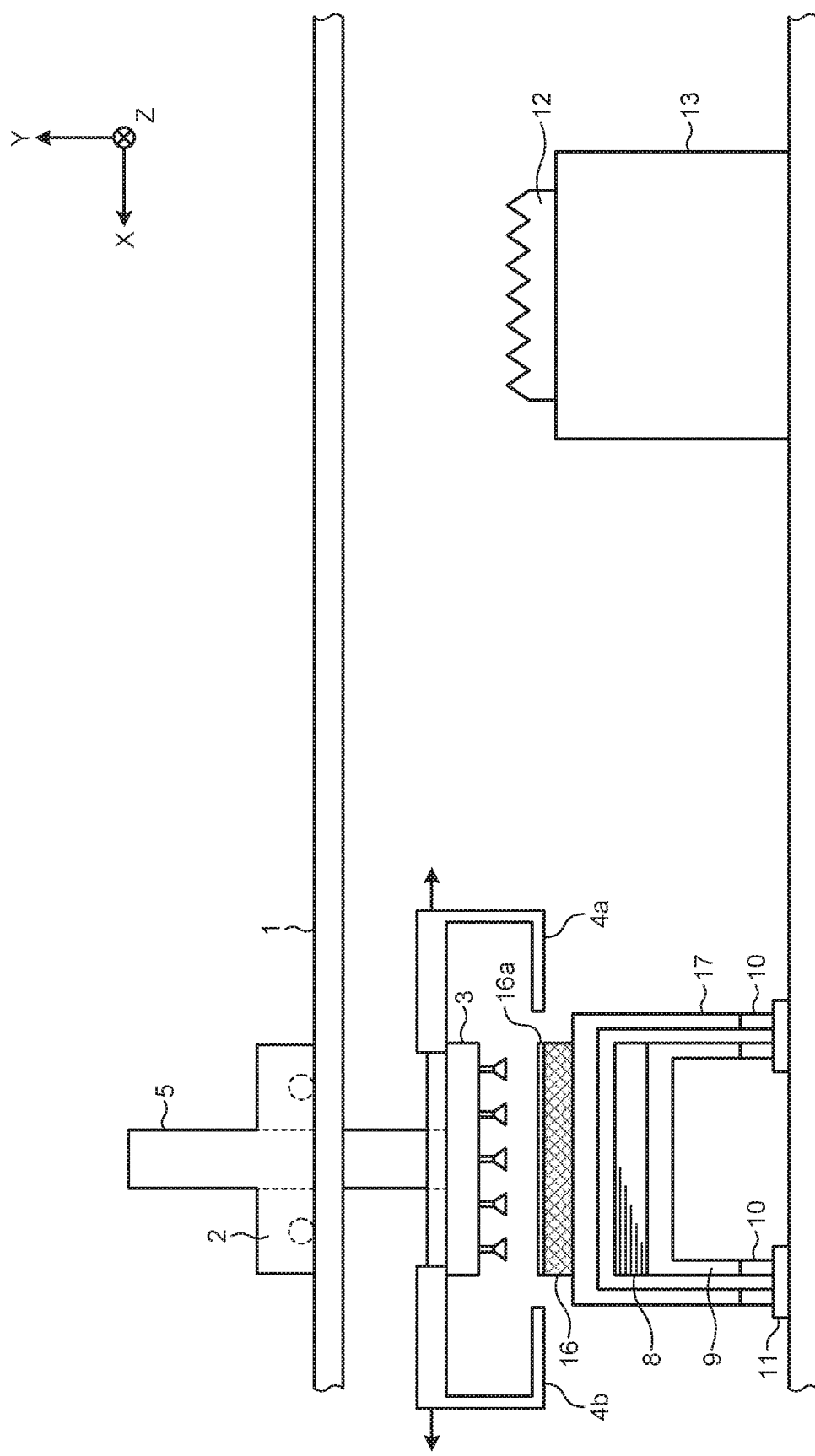
FIG. 22 is a diagram illustrating holders and a state where the descended holders perform the opening movement at the time of the unloading movement.

FIG. 22 is a diagram illustrating a state where the descended holder 4a and holder 4b perform the opening movement at the time of the unloading movement. As the driving member 40j and the driving member 40k illustrated in FIG. 2 move to be projected from the fork driver 40, the holder 4a and the holder 4b move to be separated from each other in the X-axis direction. As the holder 4a and the holder 4b move to be separated from each other, the product workpiece 16a held by the holder 4a and the holder 4b is stacked on the power storage controlling unit 16. According to the above, the unloading movement of the product workpiece 16a is completed.

As described above, the workpiece conveying device 100 includes: the traveling platform which moves on the traveling rails; the workpiece sucker which is arranged below the traveling platform; the vertical drive guide which is provided on the traveling platform and vertically drives the workpiece sucker; and the fork which is placed on the workplace sucker so as to sandwich the sucker. The fork extends from an upper portion of the sucker to a lower portion and includes the pair of holders which is moved to be separated or closer to each other, and the pair of holders stop at a specific position in the vertical direction when the sucker descends. With this structure, in the workplace conveying device 100, it is not necessary to swing the fork as in the prior art described above, and a space where the fork moves can be narrowed. Therefore, an installation space of the workpiece conveying device 100 can be reduced, a space between the fork 4 and the traveling rails 1 can be reduced, and a space in the factory can be reduced. Furthermore, according to the workpiece conveying device 100, effects such as a higher accuracy, a faster moving speed, and a less damage to the product can be obtained compared to the prior art. That is, since the conveying device disclosed in Patent Literature 1 needs to swing a pipe fork, there is a possibility that the pipe fork is rubbed against an end of a product and a large scratch is made on the product. Furthermore, the conveying device disclosed in Patent Literature 1 needs a complicated mechanism in which the pipe fork swings with a connection point of a support as a fulcrum at the time of operation, and clearances of the plurality of mechanisms are accumulated and make accuracy of the swing operation of the pipe fork be deteriorated. Furthermore, since the conveying device disclosed in Patent Literature 1 needs to swing the pipe fork, an operation with a large rotation radius is needed. Therefore, it difficult to increase a moving speed of the pipe fork. According to the workpiece conveying device 100 according to the present embodiment, since the fork 4 moves to have contact with the entire product, a large scratch is not made on a part of the product. Furthermore, it is possible to increase the moving speed of the fork 4 than the swing operation because the fork 4 moves in the XZ plane direction. Since the movement of the fork 4 can be realized by a slide mechanism, the number of operation mechanisms is reduced, and the moving accuracy is improved.

Second Embodiment

Figure 23:
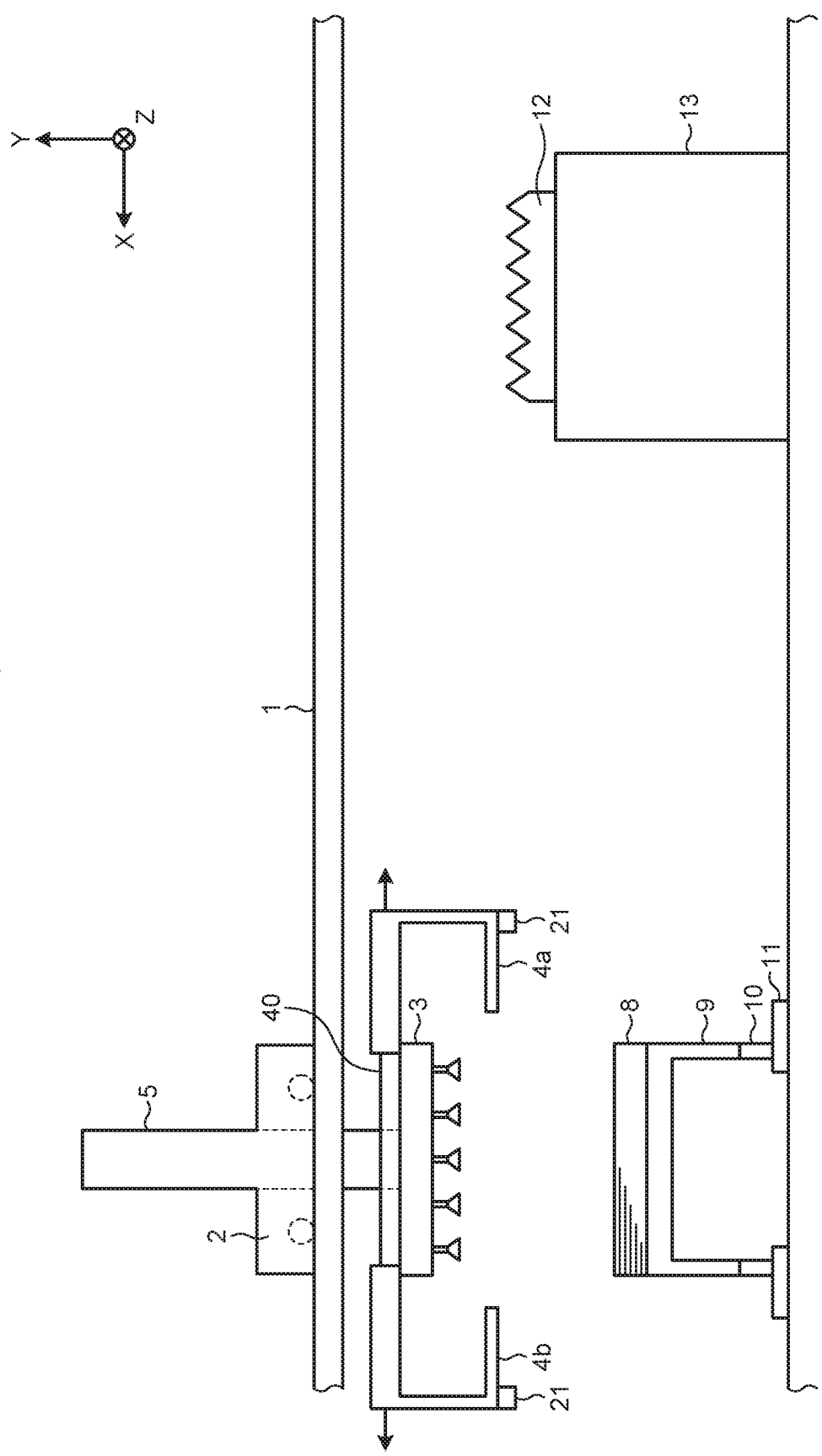
FIG. 23 is a diagram illustrating opened holders and first fixing stoppers supported by the opened holders when a workpiece conveying device according to a second embodiment of the present invention performs a loading movement.

FIG. 23 is a diagram illustrating first fixing stoppers 21 that support the holder 4a and the holder 4b which perform the opening movement when the workpiece conveying device 100 according to a second embodiment of the present invention performs the loading movement. In the loading movement, to stop the fork driver 40, the holder 4a, and the holder 4b at the time of descending movement for extracting the material workpiece 8a on the material carriage 9 at a specific position in the Y-axis direction, the first fixing stoppers 21 may be provided below the holder 4a and the holder 4b instead of rotating the rollers 40i of the fork driver 40 illustrated in FIG. 2.

The first fixing stopper 21 may be an L-shaped member which extends downward from the housing of the traveling platform 2 and is bent toward the lower portion of each of the holder 4a and the holder 4b and may be a bar-like member provided in a device (not illustrated) which operates in conjunction with the traveling platform 2. The first fixing stoppers 21 moves so as to extend in the Z-axis direction and support the holder 4a and the holder 4b before the holder 4a and the holder holding portion 4b perform the opening movement and the workpiece sucker 3 descends. After the holder 4a and the holder 4b have performed the closing movement, the first fixing stoppers 21 retreat in the Z-axis direction. The workpiece conveying device 100 according to the second embodiment includes a stopper which supports the pair of holders when the pair of holders move to be separated from each other and perform the opening movement and is separated from the pair of holders when the pair of holders move to be closer to each other and perform the closing movement. Therefore, the flexible workpiece conveying device 100 with a high degree of freedom can be obtained.

Third Embodiment

Figure 24:
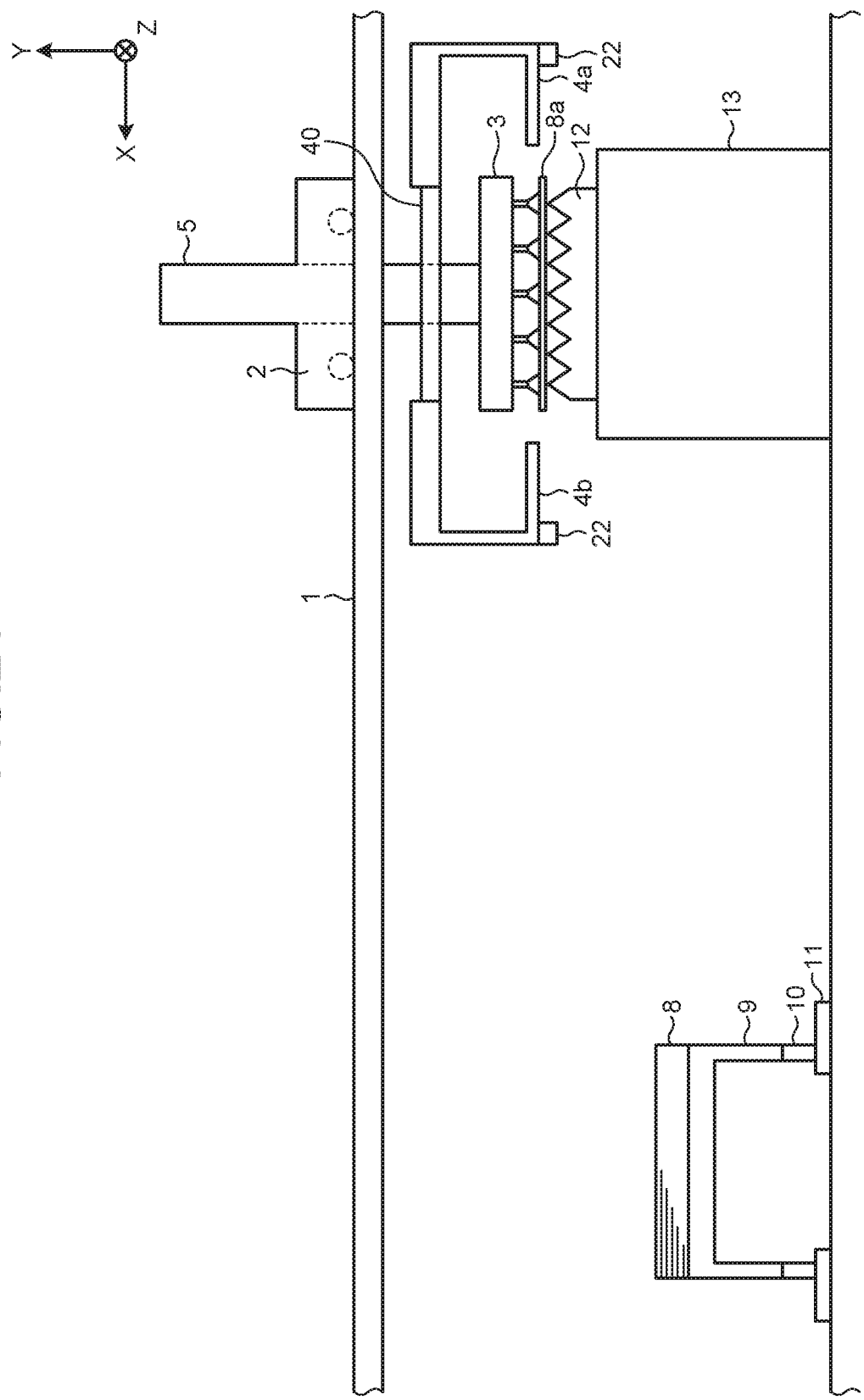
FIG. 24 is a diagram illustrating opened holding portions and second fixing stoppers supported by the opened holders when a workpiece conveying device according to a third embodiment of the present invention performs a loading movement.

FIG. 24 is a diagram illustrating second fixing stoppers 22 that support the holder 4a and the holder 4b which perform the opening movement when the workpiece conveying device 100 according to a third embodiment of the present invention performs the loading movement. In the loading movement, to stop the fork driver 40, the holder 4a, and the holder 4b at the time of descending movement for placing the material workpiece 8a on the work support 12 at a specific position in the Y-axis direction, the second fixing stoppers 22 may be provided below the holder 4a and the holder 4b instead of rotating the rollers 40i of the fork driver 40 illustrated in FIG. 2.

The second fixing stopper 22 may be an L-shaped member which extends downward from the housing of the traveling platform 2 and is bent toward the lower portion of each of the holder 4a and the holder 4b and may be a bar-like member provided in a device (not illustrated) which operates in conjunction with the traveling platform 2. The second fixing stopper 22 moves so as to extend in the Z-axis direction and support the holder 4a and the holder 4b before the holder 4a and the holder 4b perform the opening movement and the workpiece sucker 3 descends. After the holder 4a and the holder 4b have performed the closing movement, the second fixing stopper 22 retreat in the Z-axis direction. The workpiece conveying device 100 according to the third embodiment includes a stopper which supports the pair of holders when the pair of holders move to be separated from each other and performs the opening movement and is separated from the pair of holders when the pair of holders move to be closer to each other and performs the closing movement. Therefore, the flexible workpiece conveying device 100 with a high degree of freedom can be obtained.

Fourth Embodiment

Figure 25:
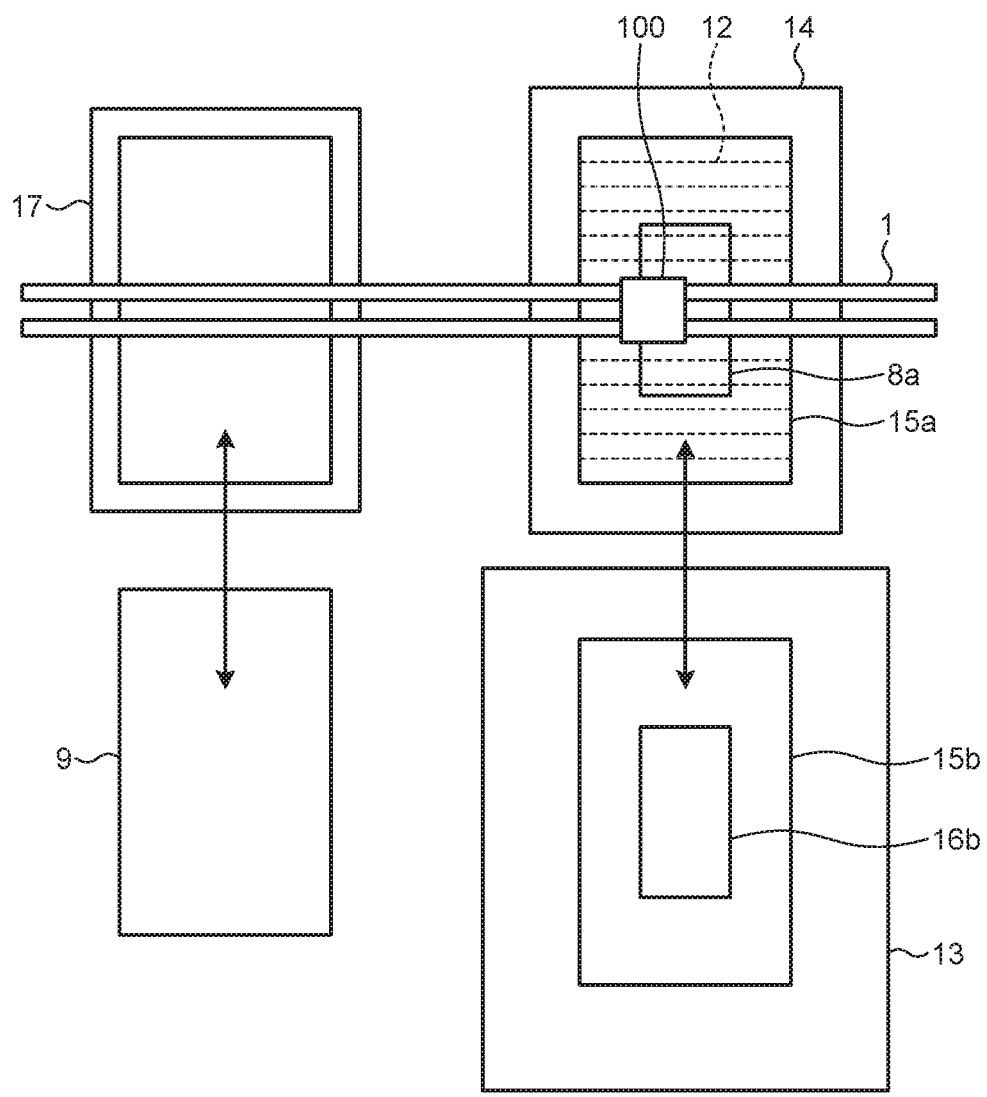
FIG. 25 is a diagram of planar view of a laser processing machine, a pallet automatic exchanging device, a product carriage, and a material carriage which operate in conjunction with a workpiece conveying device at the time of a loading movement or an unloading movement.

FIG. 25 is a diagram of planar view of the laser processing machine 13, a pallet automatic exchanging device 14, the product carriage 17, and the material carriage 9 which operate in conjunction with the workpiece conveying device 100 at the time of the loading movement or the unloading movement. A processing pallet 15a is placed on the pallet automatic exchanging device 14 attached to the laser processing machine 13, and the material workpiece 8a on which laser processing has not been performed yet is placed on the processing pallet 15a. A processing pallet 15b is placed on the laser processing machine 13, and a product workpiece 16b on which laser processing has been performed by the laser processing machine 13 is placed on the processing pallet 15b.

As described above, after the loading movement has been completed and the workpiece sucker 3 and the fork 4 have ascended, the material workpiece 8a is transferred to the laser processing machine 13, and the laser processing machine 13 starts to perform laser processing on the material workpiece 8a. The material workpiece 8a is processed to make the product workpiece 16b illustrated in FIG. 25. To convey the product workpiece 16b to the product carriage 17, the laser processing machine 13 moves along the horizontal plane and moves below the traveling rails 1. In the fourth embodiment, the positions of the laser processing machine 13 and the pallet automatic exchanging device 14 are replaced with each other in conjunction with the movement of the workpiece conveying device 100. The movement of the laser processing machine 13 and the pallet automatic exchanging device 14 is controlled by a control device (not illustrated).

On the other hand, the product carriage 17 moves to straddle the material carriage 9 as illustrated in FIGS. 13 to 22 when the product workpiece 16b is conveyed. The movement of the product carriage 17 and the material carriage 9 is controlled by a control device (not illustrated). The product carriage 17 and the material carriage 9 may be configured so that the positions of the product carriage 17 and the material carriage 9 are replaced with each other in conjunction with the movement of the workpiece conveying device 100.

The workpiece conveying device 100 according to the fourth embodiment includes the product carriage 17 and the material carriage 9 which move so that the positions on the horizontal plane are alternately replaced with each other or the product, carriage 17 and the material carriage 9 which move to be overlapped with each other in the vertical direction. Therefore, space saving can be achieved.

Furthermore, the workpiece conveying device 100 according to the fourth embodiment is configured so that the product carriage 17 is positioned above the material carriage 9. Although the product is usually taken out manually, since the take-out height comes to an appropriate position, according to the workpiece conveying device 100 according to the fourth embodiment, an effect can be obtained that the person can easily handle the products.

In the first to fourth embodiments, the workpiece sucker conveys the material workplace by holding and sucking the material workpiece. However, in a case where the product workpiece is divided into a cut component and a frame (skeleton) as seen in a product dividing device and the like, it is necessary to consider the number or arrangement of the suction pads and to perform group control of the suction. However, even when the workpiece sucker is used for sucking and conveying a cut product (component), an application region is enlarged, and the workpiece sucker is effective.

In the first to fourth embodiments, materials and products are exchanged on the pallet automatic exchanging device.

However, it may take time to load and unload. In this case, a processing time gets longer, and productivity is deteriorated. However, to directly place or take out the material workpiece and the product workpiece on the laser processing machine is effective for cost reduction and space saving.

Furthermore, in the first to fourth embodiments, a case of a single laser processing machine has been described. However, a plurality of laser processing machines may be provided in a direction in which rails extend, and similarly, three or more material carriages or product carriages may be provided. A plurality of workpiece suckers and forks which integrally travel may be provided, and the arrangement of the laser processing machine, the carriages, and the fork is not limited to those in the first to fourth embodiments. Needless to say, even with the above configuration, the effect of the invention similar to the above can be obtained.

The structures illustrated in the above embodiment indicate exemplary contents of the present invention and can be combined with other known technique. Further, the structures illustrated in the embodiment can be partially omitted and changed without departing from the scope of the present invention.

REFERENCE SIGNS LIST 1 traveling rail; 1a spacing; 2 traveling platform; 2a through-hole; 2b, 2c, 40i roller; 3 workpiece sucker; 3a, 3b, 40a, 40b, 40d one end portion; 3c, 40c, 40f other end portion; 4 fork; 4a, 4b holder; 5, 44a, 44b shaft; 6 suction pad; 6a skirt portion; 6b connection pipe; 8 loaded material; 8a material workpiece; 9 material carriage; 10 wheel; 11 rail; 12 work support; 13 laser processing machine; 14 pallet automatic exchanging device; 15a, 15b processing pallet; 16 power storage controlling unit; 16a, 16b product workpiece; 17 product carriage; 21 first fixing stopper; 22 second fixing stopper; 40 fork driver; 40e first groove; 40g second groove; 40h through-hole; 40j, 40k driving member; 41a, 41b slider; 42a, 42b extending portion; 43a, 43b comb-like member; 100 workpiece conveying device.

The invention claimed is:

1. A workpiece conveying device comprising:
a traveling platform to move on traveling rails;
a workpiece sucker arranged below the traveling platform;
a vertical drive guide, including a shaft, provided on the traveling platform, to vertically drive the workpiece sucker by vertically moving the shaft;
a fork to slide so as to sandwich the workpiece sucker; and
a fork driver provided on the shaft between the workpiece sucker and the traveling platform and to drive the fork, wherein
the fork includes a pair of holders that performs an opening movement to be guided by a groove formed in the fork driver and to be separated from each other when the workpiece sucker vertically moves and performs a closing movement to be guided by the groove and to be closer to each other when the workpiece sucker does not vertically move, and
the pair of holders include a slider that is positioned on an upper side of the fork driver when the workpiece sucker does not vertically move.

2. The workpiece conveying device according to claim 1, wherein
the pair of holders stop at a specific position when the workpiece sucker vertically moves.

3. The workpiece conveying device according to claim 2, further comprising:
a stopper to support the pair of holders when the pair of holders perform an opening movement to be separated from each other and to be separated from the pair of holders when the pair of holders perform a closing movement to be closer to each other.

4. The workpiece conveying device according to claim 2, further comprising:
a product carriage and a material carriage to move so that positions of the product carriage and the material carriage are alternately replaced with each other on a horizontal plane or a product carriage and a material carriage to move to be overlapped with each other in a vertical direction.

5. The workpiece conveying device according to claim 4, wherein
the product carriage is positioned above the material carriage.

6. The workpiece conveying device according to claim 1, further comprising:
a product carriage and a material carriage to move so that positions of the product carriage and the material carriage are alternately replaced with each other on a horizontal plane or the product carriage and a material carriage to move to be overlapped with each other in a vertical direction.

7. The workpiece conveying device according to claim 6, wherein
the product carriage is positioned above the material carriage.

* * * * *